United States Patent
Robb et al.

(10) Patent No.: US 10,859,648 B2
(45) Date of Patent: Dec. 8, 2020

(54) SYSTEMS AND METHODS FOR A CONFIGURABLE RADIO FREQUENCY COIL FOR MR IMAGING

(71) Applicant: GE Precision Healthcare LLC, Milwaukee, WI (US)

(72) Inventors: Fraser John Laing Robb, Aurora, OH (US); Robert Steven Stormont, Hartland, WI (US); Victor Taracila, Beachwood, OH (US); Dan Kenrick Spence, Hartland, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 16/372,305

(22) Filed: Apr. 1, 2019

(65) Prior Publication Data
US 2020/0309876 A1 Oct. 1, 2020

(51) Int. Cl.
*G01R 33/36* (2006.01)
*G01R 33/3415* (2006.01)

(52) U.S. Cl.
CPC ..... *G01R 33/3664* (2013.01); *G01R 33/3415* (2013.01)

(58) Field of Classification Search
CPC .................. G01R 33/3664; G01R 33/3415
See application file for complete search history.

(56) References Cited

U.S. PATENT DOCUMENTS

| | | | | |
|---|---|---|---|---|
| 4,620,155 A | * | 10/1986 | Edelstein | G01R 33/3415 324/322 |
| 4,924,868 A | * | 5/1990 | Krause | G01R 33/341 324/318 |
| 5,097,210 A | * | 3/1992 | Requardt | G01R 33/341 324/318 |
| 5,462,055 A | * | 10/1995 | Casey | A61N 1/403 324/315 |
| 2003/0132750 A1 | * | 7/2003 | Machida | G01R 33/3664 324/322 |
| 2004/0106336 A1 | * | 6/2004 | Menon | G01R 33/34046 439/894 |
| 2007/0282194 A1 | * | 12/2007 | Wiggins | G01R 33/5659 600/422 |
| 2007/0285199 A1 | * | 12/2007 | Okamoto | G01R 33/365 335/296 |
| 2008/0007250 A1 | * | 1/2008 | Wiggins | G01R 33/34084 324/200 |
| 2008/0129296 A1 | * | 6/2008 | Fischer | G01R 33/3415 324/318 |
| 2008/0218168 A1 | * | 9/2008 | Takagi | G01R 33/3415 324/309 |

(Continued)

Primary Examiner — G. M. A Hyder

(57) ABSTRACT

Various systems are provided for magnetic resonance imaging (MRI). In one example, a method includes selecting a contour topology for operating a configurable radio frequency (RF) coil assembly, wherein the configurable RF coil assembly includes an array of conductive segments coupled via a plurality of switches, and the contour topology defines a configuration of one or more RF coil elements formed on the configurable RF coil assembly. The method further includes, during a receive mode, at least partially activating one or more subsets of switches of the plurality of switches according to the selected contour topology to form the one or more RF coil elements.

16 Claims, 9 Drawing Sheets

(56) References Cited

U.S. PATENT DOCUMENTS

| | | | |
|---|---|---|---|
| 2011/0148418 A1* | 6/2011 | Findeklee | H01P 5/12 |
| | | | 324/318 |
| 2012/0081115 A1* | 4/2012 | Reykowski | G01R 33/3657 |
| | | | 324/309 |
| 2013/0021033 A1* | 1/2013 | Stoeckel | A61B 5/055 |
| | | | 324/318 |
| 2013/0221967 A1* | 8/2013 | Li | G01R 33/34092 |
| | | | 324/322 |
| 2014/0070808 A1* | 3/2014 | Reykowski | G01R 33/3657 |
| | | | 324/309 |
| 2015/0253399 A1* | 9/2015 | Okamoto | G01R 33/3664 |
| | | | 324/322 |
| 2018/0081006 A1 | 3/2018 | Robb et al. | |
| 2018/0081008 A1* | 3/2018 | Yang | A61B 5/0035 |
| 2019/0154775 A1* | 5/2019 | Stack | G01R 33/34084 |
| 2019/0293738 A1* | 9/2019 | Popescu | G01R 33/3664 |

\* cited by examiner

SYSTEMS AND METHODS FOR A CONFIGURABLE RADIO FREQUENCY COIL FOR MR IMAGING

FIELD

Embodiments of the subject matter disclosed herein relate to magnetic resonance imaging (MRI), and more particularly, to MRI radio frequency (RF) coils.

BACKGROUND

Magnetic resonance imaging (MRI) is a medical imaging modality that can create images of the inside of a human body without using x-rays or other ionizing radiation. MRI systems include a superconducting magnet to create a strong, uniform, static magnetic field $B_0$. When an imaging subject is placed in the magnetic field $B_0$, the nuclear spins associated with the hydrogen nuclei in the imaging subject become polarized such that the magnetic moments associated with these spins become preferentially aligned along the direction of the magnetic field $B_0$, resulting in a small net magnetization along that axis. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil assemblies and is transformed into the image using reconstruction algorithms.

Different MR imaging protocols may prioritize different imaging parameters, depending on the goal of the imaging protocol, aspects of the imaging subject, and so forth. For example, some imaging protocols may prioritize imaging penetration into the imaging subject over fast imaging, while other imaging protocols may prioritize a low signal to noise ratio. These different imaging parameters may be affected by the configuration of the RF coil assemblies. Typically, the RF coil assemblies include a plurality of individual RF coil elements that are substantially fixed into place relative to a substrate on which the RF coil elements are mounted and thus may have fixed configurations (e.g., fixed RF coil geometry, fixed number of RF coil elements, etc.). Because typical RF coil assemblies cannot be easily adjusted, it may be difficult to achieve all desired imaging parameters with a single RF coil assembly.

BRIEF DESCRIPTION

In one embodiment, a method for magnetic resonance imaging (MRI) includes selecting a contour topology for operating a configurable radio frequency (RF) coil assembly, wherein the configurable RF coil assembly includes an array of conductive segments coupled via a plurality of switches, and the contour topology defines a configuration of one or more RF coil elements formed on the configurable RF coil assembly, and during a receive mode, at least partially activating one or more subsets of switches of the plurality of switches according to the selected contour topology to form the one or more RF coil elements.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

Figure 2:
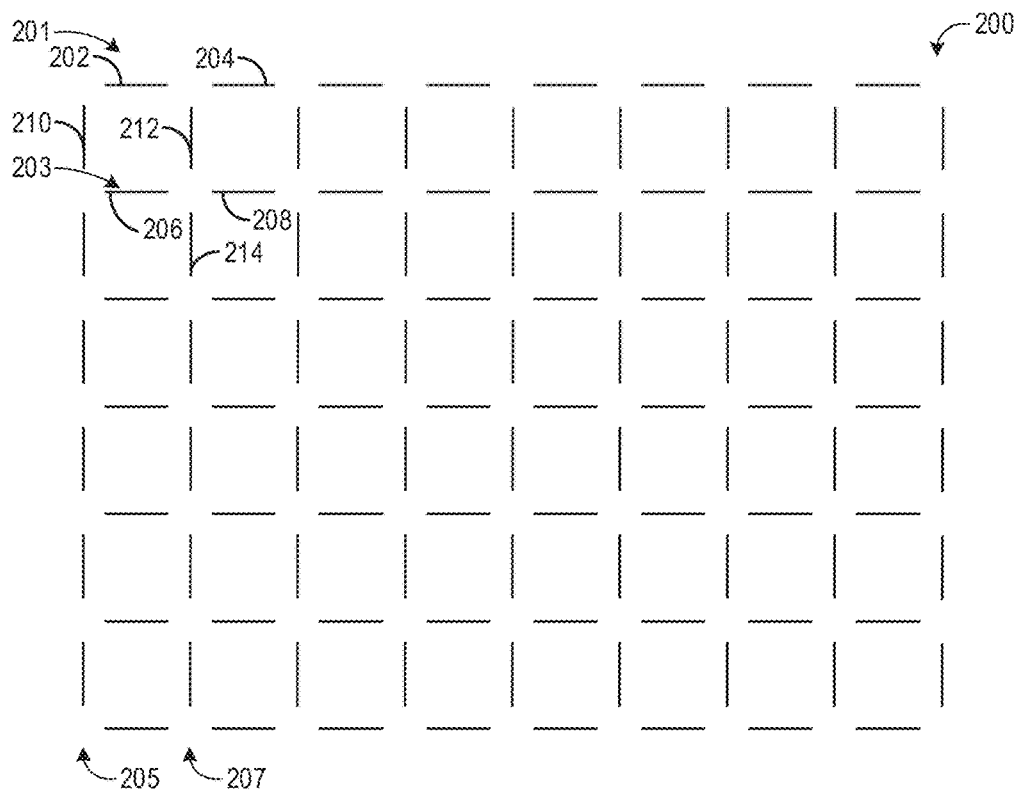
FIG. 2 schematically shows an example zero-order array of RF coil segments according to an exemplary embodiment.
Figure 3:
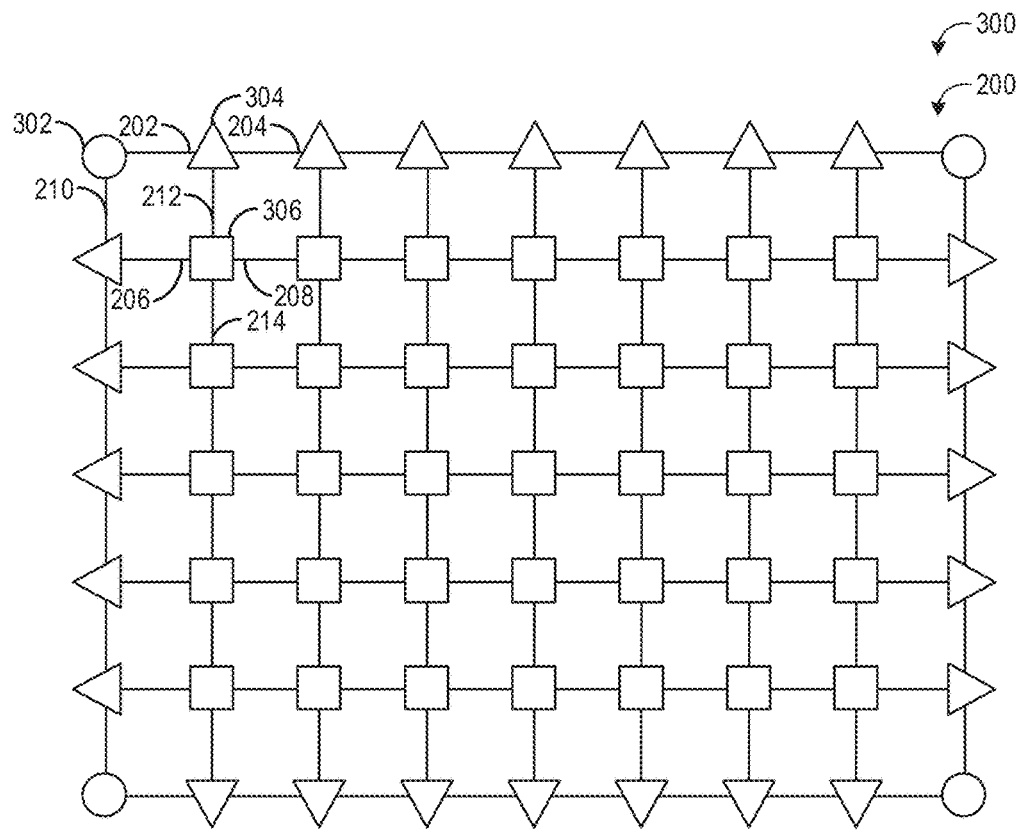
FIG. 3 schematically shows an example configurable RF coil assembly comprising the array of RF coil segments of FIG. 2 and a plurality of switches.
Figure 4:
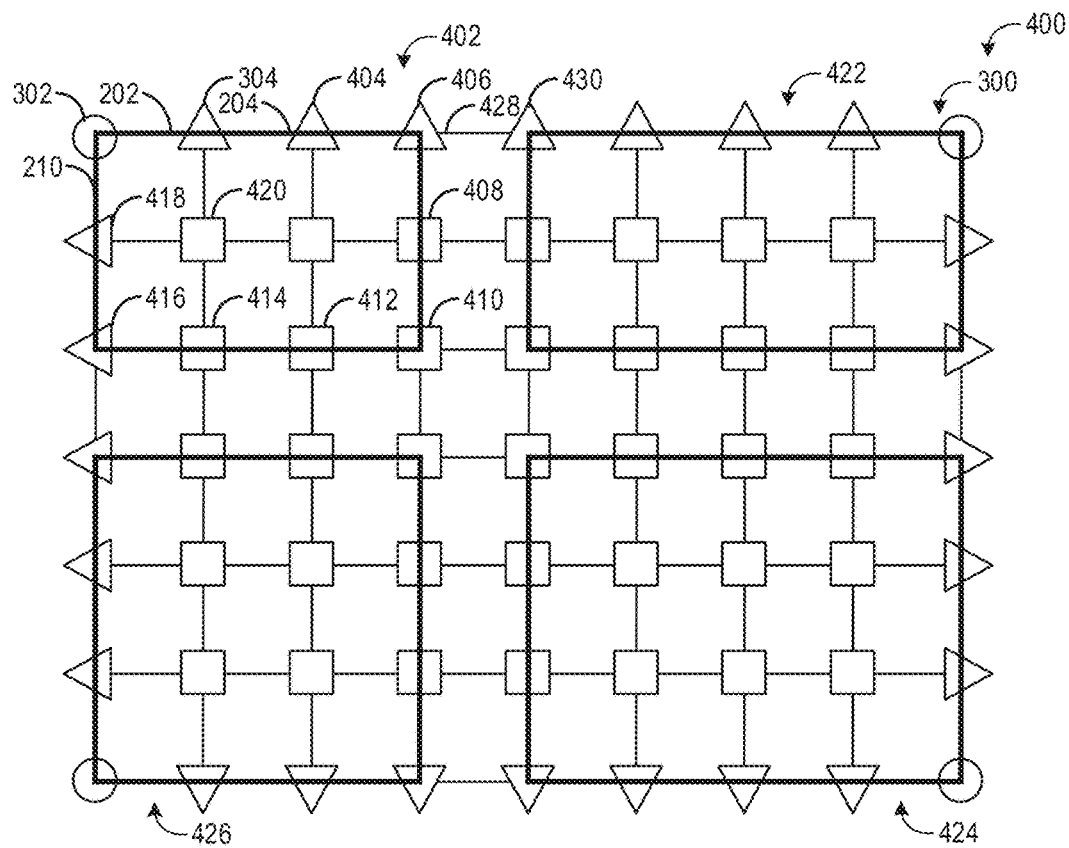
FIG. 4 shows the configurable RF coil assembly of FIG. 3 in a first switching configuration.
Figure 6:
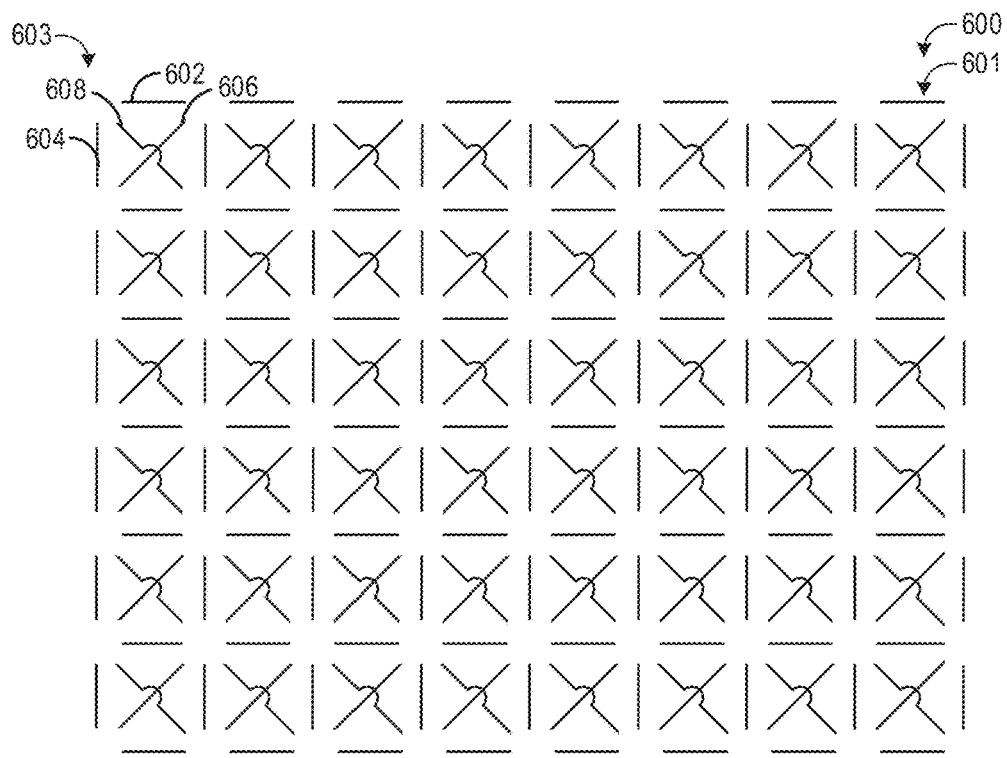
FIG. 6 schematically shows an example first-order array of RF coil segments according to an exemplary embodiment.
Figure 7:
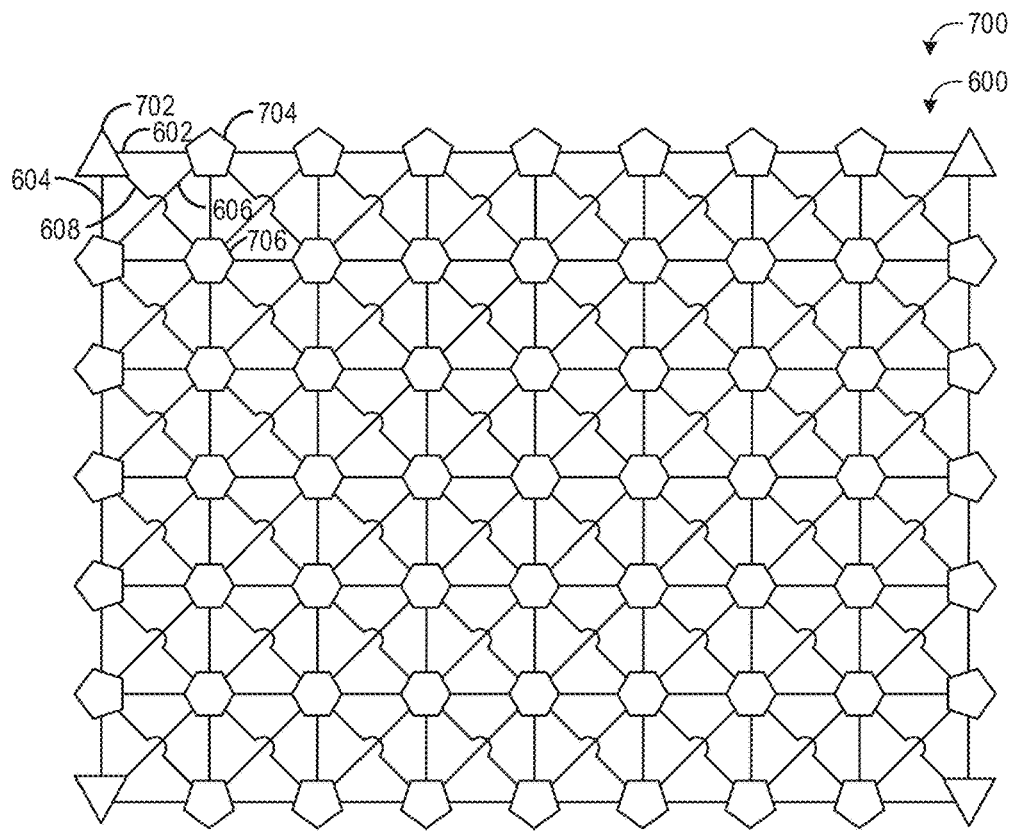
FIG. 7 schematically shows an example configurable RF coil assembly comprising the array of RF coil segments of FIG. 6 and a plurality of switches.
Figure 8A:
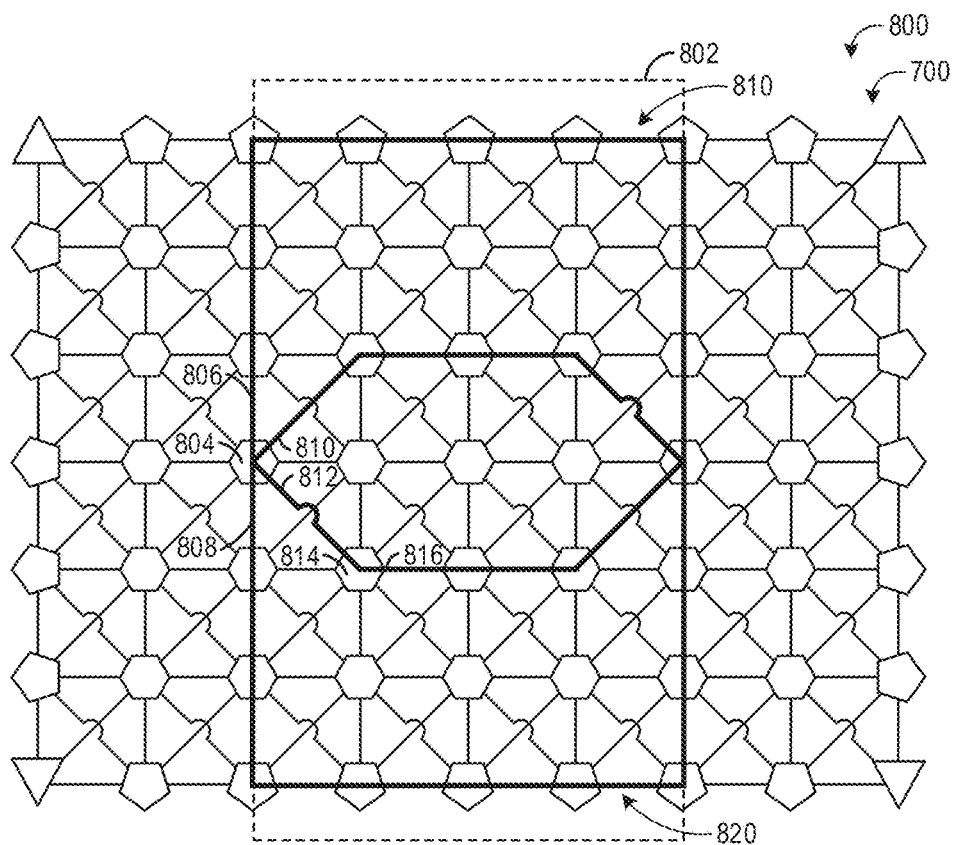
FIG. 8A shows the configurable RF coil assembly of FIG. 7 in a first switching configuration.
Figure 9:
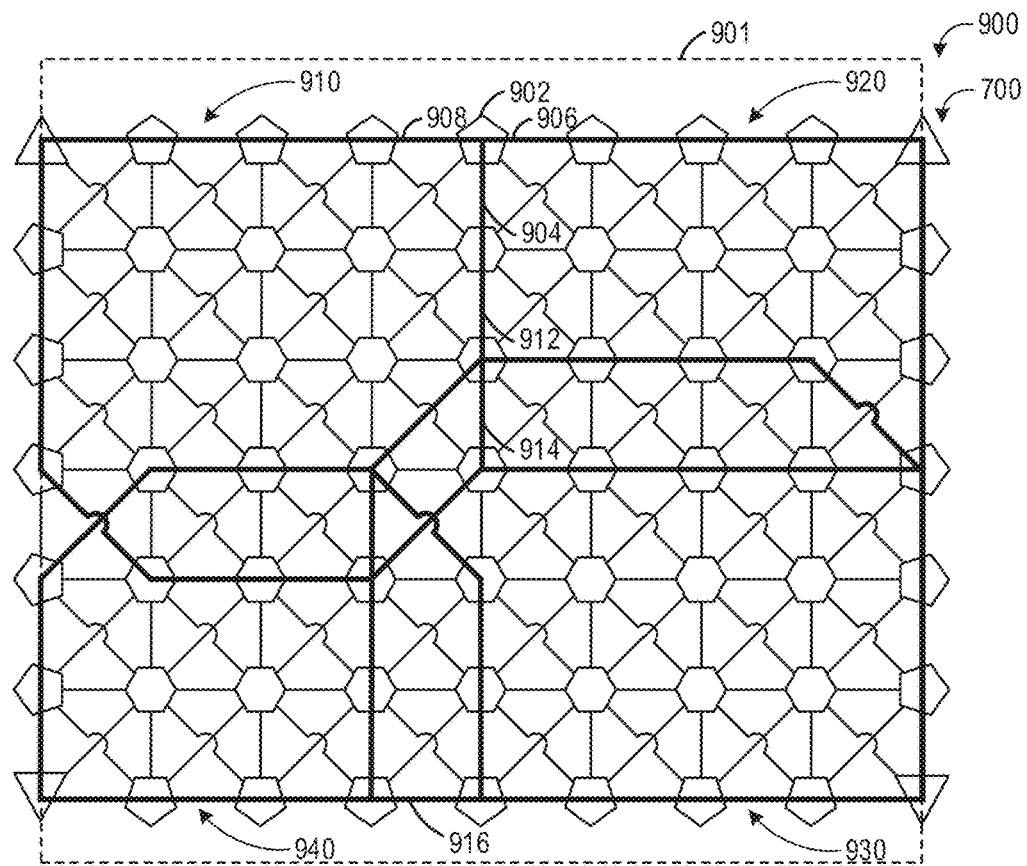
FIG. 9 shows the configurable RF coil assembly of FIG. 7 in a second switching configuration.
Figure 10:
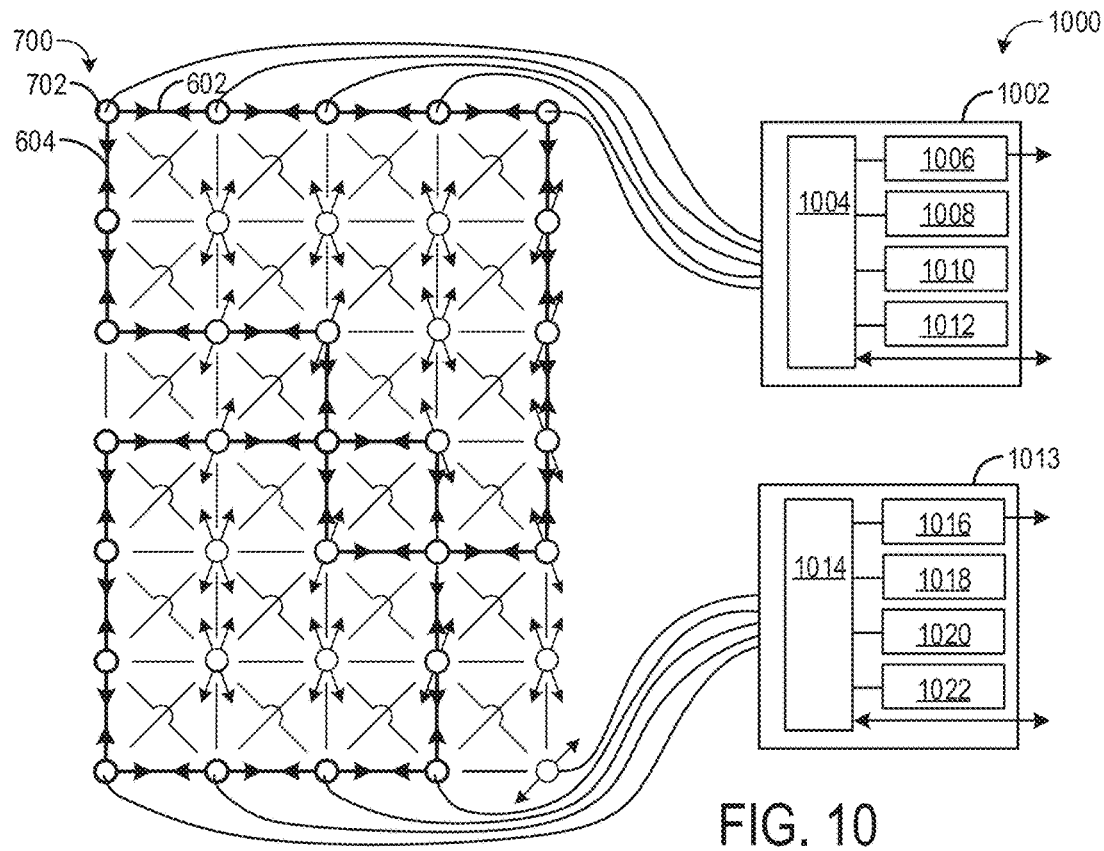
FIG. 10 shows a schematic partial view of the configurable RF coil assembly of FIG. 7.
Figure 11:
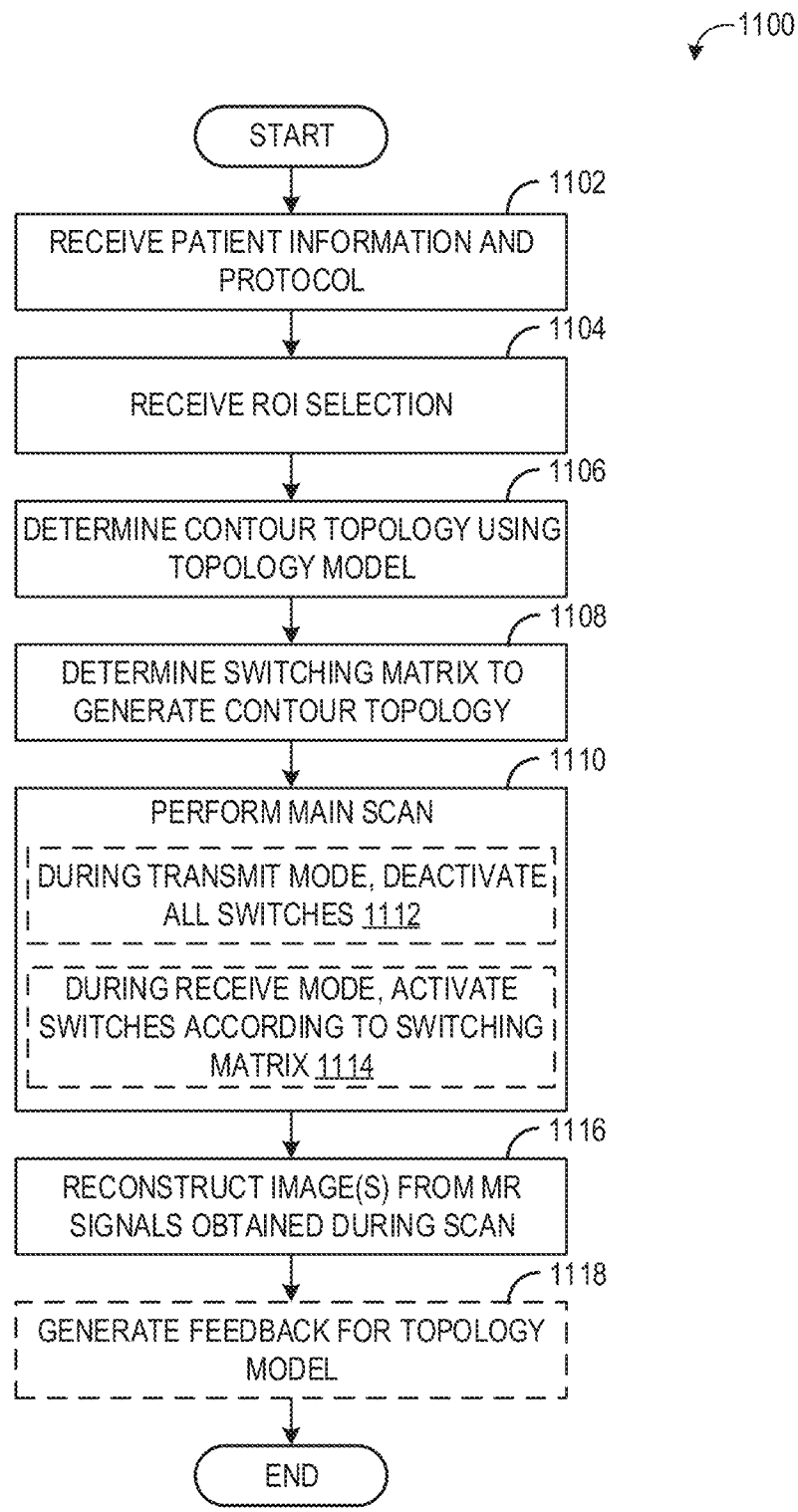
FIG. 11 is a flow chart illustrating an example method for performing an imaging scan using a configurable RF coil assembly.
Figure 12:
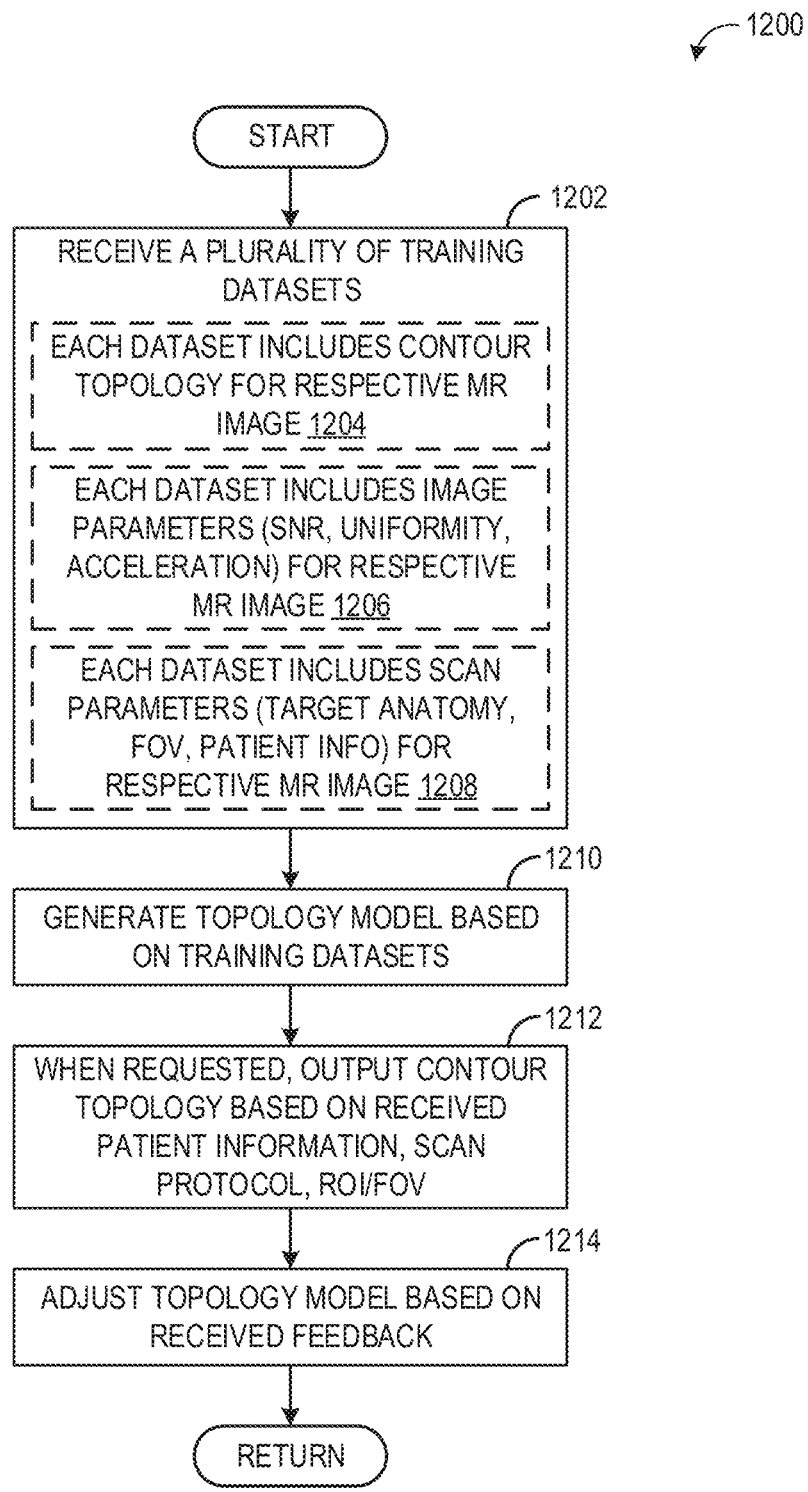
FIG. 12 is a flow chart illustrating an example method for determining a contour topology of a configurable RF coil assembly.

The following description relates to various embodiments of a radio frequency (RF) coil assembly for an MRI system. An MRI system, such as the MRI system shown by FIG. 1, includes a receive RF coil unit that may be comprised of one or more RF coil elements. For example, the receive RF coil unit may include a configurable RF coil assembly, examples of which are shown in FIGS. 3 and 7. The configurable RF coil assembly is comprised of an array of conductive segments, as shown in FIGS. 2 and 6, and a plurality of switches. Each switch may include multiple terminals that may be separately coupled and decoupled, as shown in FIGS. 5A, 5B, and 13 and FIGS. 8B, 8C, and 14. Each terminal of each switch may be coupled or decoupled according to a switching matrix in order to form a target contour topology of RF coil elements. For example, as shown in FIG. 4, a first contour topology may include separate, non-overlapping RF coil elements. A second contour topology may include overlapping RF coil elements that span a field of view (FOV) that only extends across a portion of the configurable RF coil assembly, as shown in FIG. 8A. A third contour topology may include overlapping RF coil elements that span a FOV that extends across an entirety of the configurable RF coil assembly, as shown in FIG. 9. The different contour topologies may be selected based on target imaging parameters, as shown by the method of FIG. 11, and in some examples the selection may be made by a model trained using machine learning algorithms, as shown by the method of FIG. 12. Controller boards, as shown in FIG. 10, may control (i.e., open or close) the switches so that the segments form RF coil elements of the desired contour topology and may receive signals obtained by the formed RF coil elements for processing. In this way, a plurality of different effective RF coil element arrays, including different RF coil element geometries and/or different numbers of RF coil elements, may be provided using a single configurable RF coil assembly.

Figure 1:
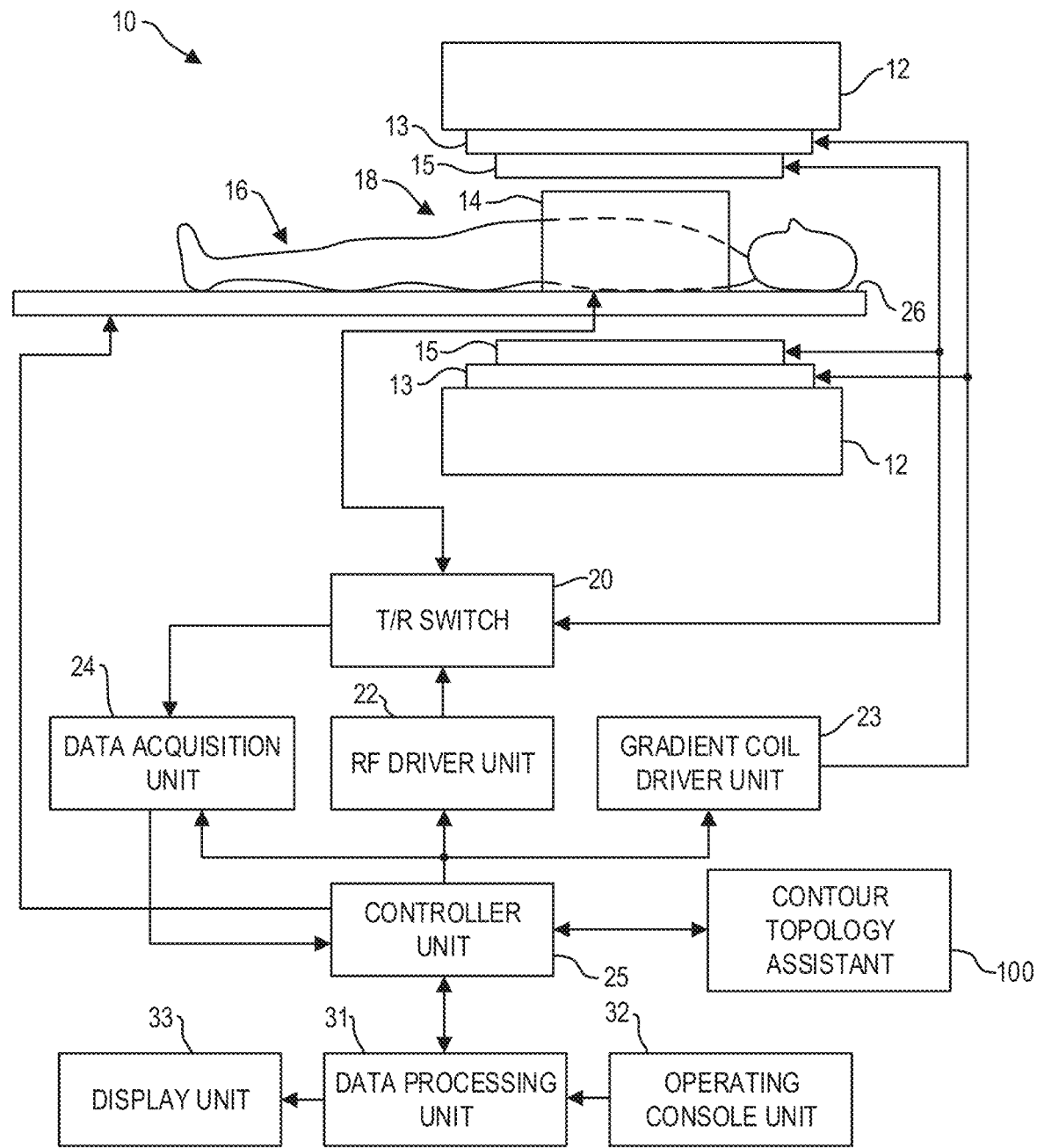
FIG. 1 is a block diagram of an MRI system according to an exemplary embodiment.

FIG. 1 illustrates a magnetic resonance imaging (MRI) apparatus 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

During a scan, RF coil interfacing cables (not shown in FIG. 1) may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil unit 14 receives the MR signals. More generally, RF coils are used to transmit RF excitation signals ("transmit coil"), and to receive the MR signals emitted by an imaging subject ("receive coil"). In some embodiments, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may be separate components. For enhanced image quality, however, it may be desirable to provide a receive coil that is mechanically and electrically isolated from the transmit coil. In such case it is desirable that the receive coil, in its receive mode, be electromagnetically coupled to and resonant with an RF "echo" that is stimulated by the transmit coil. However, during transmit mode, it may be desirable that the receive coil is electromagnetically decoupled from and therefore not resonant with the transmit coil, during actual transmission of the RF signal. Such decoupling averts a potential problem of noise produced within the auxiliary circuitry when the receive coil couples to the full power of the RF signal. Additional details regarding the uncoupling of the receive RF coil will be described below.

The RF coil unit 14 may be comprised of a plurality of individual RF coil elements. The individual RF coil elements may be conductive loops (or other shapes) that are each configured to obtain local RF signals (also referred to as MR signals) that are emitted when the nuclear spins (e.g., of the hydrogen nuclei of the imaging subject) relax back to their rest energy state following a transmit RF pulse. These RF coil elements may be configurable, such that different RF coil element numbers, sizes, geometries, etc., may be created using a single RF coil assembly. As will be described in more detail below, the RF coil unit 14 may include a plurality of conductive segments coupled via a plurality of switches. The terminals of the switches may be controlled to be open or closed according to a switching matrix, in order to form one or more effective RF coil elements configured to receive MR signals during an MRI scan. For example, the switches may be controlled so that one or more subsets of the segments are electrically coupled to form one or more RF coil elements shaped as loops. The switches may be controlled differently for different patients and different scanning protocols, in order to form different configurations of RF coil elements. For example, during a first scan of a first patient, the switches may be controlled to form 12 RF coil elements, while during a second scan of a second patient, the switches may be controlled to form 24 RF coil elements. The switches may be controlled to form different RF coil element configurations in order to obtain desired scanning parameters, such as target field of view, target imaging speed, target imaging depth, and/or target signal-to-noise ratio (SNR), which may vary based on patient size, target anatomy being scanned, diagnostic goal of the scan, or other variables.

In some embodiments, an artificial-intelligence based model may select an RF coil element configuration (e.g., number of RF coil elements, size of RF coil elements, overlap of RF coil elements, etc.) for a given MRI scan. The model, referred to as a contour topology model, may be trained using a plurality of training datasets that include RF coil element configuration and patient information as inputs and scanning quality parameters (e.g., SNR, acceleration, imaging depth) as outputs. Thus, in some embodiments, MRI apparatus 10 may include a contour topology assistant 100. Contour topology assistant 100 may be an artificial intelligence-based module that may be stored and/or executed on a suitable device or devices. As shown, contour topology assistant 100 is stored on a device that is remote from controller unit 25, such as a central server that is in wired or wireless communication with controller unit 25. Contour topology assistant 100 is trained to select an RF coil element configuration that best balances desired scanning quality parameters for a given patient and target anatomy being imaged.

Contour topology assistant 100 may be implemented in a non-transitory memory and may be executable by one or more processors of a computing system, such as a central server in communication with controller unit 25 and/or other computing devices, such as clinician devices and/or medical facility operational systems. In some embodiments, contour topology assistant 100 may be fully or partially implemented on controller unit 25, or a device that is included as part of the medical facility operational systems (where the medical facility operational systems includes one or more computing devices configured to store and/or control a variety of medical facility-, operator-, and patient-related information, including but not limited to patient information and patient care/imaging protocols and workflows). In some embodiments, contour topology assistant 100 may be implemented in a cloud in communication with the controller unit 25. In some embodiments, portions of contour topology assistant 100 are implemented on different devices, such as any appropriate combination of the controller unit 25, an operator device, the cloud, etc.

Contour topology assistant 100 may be trained to select an appropriate RF coil element configuration using machine learning (e.g., deep learning), such as random forest, neural networking, or other training mechanisms. For example, contour topology assistant 100 may be trained using scanning parameters of a plurality of images as well as the outcome(s) of each image. The scanning parameters of the images may include the RF coil element configuration used to obtain the images (e.g., number, size, and geometry of the RF coil elements, as well as level of overlap of the RF coil elements), target anatomy being imaged, field of view of the imaging, region of interest of the imaging (if different than the field of view), parameters of the patient being imaged (such as patient age, patient size, etc.), and diagnostic goal of the imaging (such as lesion detection). The outcome(s) of each image may include image quality parameters (e.g., SNR, level of image artifacts) and scan quality parameters (e.g., acceleration, imaging depth). The contour topology assistant 100 may thus be trained, based on the training scanning parameters and associated known outcomes, to select an appropriate RF coil element configuration that will provide desired image/scan quality parameters for a given patient and type of scan. Contour topology assistant 100 may continue to learn from future scans, as feedback may be provided to contour topology assistant 100 after training is complete.

Turning now to FIG. 2, a schematic view of an array of RF coil segments 200 is shown. The array of RF coil segments 200 includes a plurality of segments that form the basis of a configurable RF coil assembly (shown in FIG. 3). Each segment of the array of RF coil segments 200 is comprised of material configured to generate an MR signal during an imaging scan by being induced to generate an electric current when exposed to changes in magnetic flux. In some embodiments, each segment may be comprised of copper or other suitable conductor.

In some embodiments, each segment may be comprised of at least two parallel conductors that form a distributed capacitance along the length of the segment. Distributed capacitance (DCAP), as used herein, represents a capacitance exhibited between conductors that distributes along the length of the conductors and may be void of discrete or lumped capacitive components and discrete or lumped inductive components. The DCAP can also be called incorporated capacitance. In some embodiments, the capacitance may distribute in a uniform manner along the length of the conductors.

In some embodiments, a dielectric material encapsulates and separates the first and second conductors of each segment. The dielectric material may be selected to achieve a desired distributive capacitance. For example, the dielectric material may be selected based on a desired permittivity E. In particular, the dielectric material may be air, rubber, plastic, or any other appropriate dielectric material. In some embodiments, the dielectric material may be polytetrafluoroethylene (pTFE). The dielectric material may surround the parallel conductive elements of the first and second conductors of each segment. Alternatively, the first and second conductors may be twisted upon one another to from a twisted pair cable. As another example, the dielectric material may be a plastic material. The first and second conductors may form a coaxial structure in which the plastic dielectric material separates the first and second conductors. As another example, the first and second conductors may be configured as planar strips.

The array of RF coil segments 200 comprises the plurality of segments which may have some series capacitance to reduce positive reactance. When segments are electrically coupled to form loops, as will be explained below, this capacitance may balance the inductance of the generated loops. Capacitance may be inserted as distributed capacitance, as described above, or as lumped capacitors. In some embodiments, each segment includes a tuning capacitor with variable capacitance for matching the frequency of the electrical resonance of the coil circuit with the frequency of the nuclear MR of the spins in the tissue.

The plurality of segments are arranged into rows and columns. For example, a first row 201 includes eight segments that are aligned along a common axis (as shown, each segment in first row 201 is oriented horizontally so that a longitudinal axis of each segment is aligned along a common, horizontal axis). Each segment of first row 201, such as first segment 202 and second segment 204, is equal in length and is spaced apart from neighboring segments in the row by an equal amount. The array of RF coil segments 200 includes seven rows, each row similar to first row 201. For example, a second row 203 includes eight segments, including third segment 206 and fourth segment 208, each oriented horizontally and aligned along a common, horizontal axis. Each segment of second row 203 may be aligned vertically with a corresponding segment of first row 201 (e.g., third segment 206 is aligned with first segment 202).

The array of RF coil segments 200 includes a plurality of columns of segments, such as first column 205 and second column 207. Each column includes six segments oriented vertically and aligned along a common axis, such that a longitudinal axis of each segment of a given column is aligned along a common, vertical axis. Each segment of first column 205, such as fifth segment 210, is equal in length and is spaced apart from neighboring segments in the column by an equal amount. The array of RF coil segments 200 includes six columns, each column similar to first column 205. For example, second column 207 includes six segments, including sixth segment 212 and seventh segment 214, each oriented vertically and aligned along a common, vertical axis. Each segment of second column 207 may be aligned horizontally with a corresponding segment of first column 205 (e.g., fifth segment 210 is aligned with sixth segment 212).

In this way, the segments of the array of RF coil segments 200 are arranged in a non-overlapping manner, with each segment spaced apart and not touching any other segments of the array. Such a configuration may be referred to as a zero-order array, which indicates that none of the segments overlap. While not shown in FIG. 2, each segment of the array of RF coil segments 200 may be mounted on (e.g., glued, stitched, or otherwise coupled to) a suitable substrate. The substrate may be a flexible substrate (e.g., that is transparent to RF signals, such as one or more layers of Nomex® material or Nomex Nano® material) or rigid substrate (e.g., polycarbonate). In still further examples, the array of RF coil segments 200 may include segments formed from copper traces patterned onto a flexible substrate, such as polyimide.

It is to be understood that the number and arrangement of segments shown in FIG. 2 is exemplary, and other configurations are possible. For example, the array may have any number of rows and/or columns of segments, such as more or fewer than nine columns or more or fewer than seven rows. Further, while each segment is shown in FIG. 2 has having equal length and width and is spaced apart from neighboring segments in a similar manner, other configurations are possible, such as segments having different lengths.

In order to form one or more RF coil elements capable of receiving MR signals, each segment of the array of RF coil segments is coupled to two switches. Each switch may include two movable elements, referred to herein as hands, that may be positioned to form desired RF coil element geometries. FIG. 3 shows a configurable RF coil assembly 300 comprised of the array of RF coil segments 200 and a plurality of switches. In some embodiments, the configurable RF coil assembly 300 may be a surface receive coil, which may be single- or multi-channel. The configurable RF coil assembly 300 may be a non-limiting example of RF coil unit 14 of FIG. 1 and as such may operate at one or more frequencies in the MRI apparatus 10.

While each switch of the plurality of switches includes two hands, different switches may be coupled to different numbers of segments, and hence may have different numbers of what is referred to herein as terminal nodes. For example, the plurality of switches may include a first set of two-terminal node switches, such as first switch 302, shown as circles in FIG. 3. The plurality of switches may further include a second set of three-terminal node switches, such as second switch 304, shown as triangles in FIG. 3. The plurality of switches may further include a third set of four-terminal node switches, such as third switch 306, shown as squares in FIG. 3. Thus, each corner of the configurable RF coil assembly 300 includes a two-terminal node switch, each outer switch (other than the corner switches) is a three-terminal node switch, and each inner switch is a four-terminal node switch.

Each segment is configured to couple to two switches. For example, first segment 202 may be coupled to first switch 302 at a first terminal of first segment 202 and to second switch 304 at a second terminal of first segment 202. Each two-terminal node switch may be coupled to two segments. For example, first switch 302 is configured to couple to first segment 202 and fifth segment 210. Each three-terminal switch is configured to couple to two of three segments. For example, second switch 304 may couple to two of first segment 202, second segment 204, and sixth segment 212. Each four-terminal switch is configured to couple to two of four segments. For example, third switch 306 may couple to two of third segment 206, fourth segment 208, sixth segment 212, and seventh segment 214.

As will be explained in more detail below with respect to FIGS. 5A and 5B, each switch may be controlled to decouple the switch from the switch's associated terminals (referred to as an open switch) or to electrically couple two terminals (and couple the two terminals to a corresponding coil-interfacing cable) via the switch (referred to as a closed switch). When closed, the switch may electrically couple two terminals, such that each of the two terminals may allow current flow along the respective segment (assuming the circuit formed by the closing of the terminal is otherwise closed). When open, the switch may decouple the terminals associated with the switch, such that the terminals may not allow current flow along the respective segments. By selectively opening some terminals while closing other terminals, different segments may be electrically coupled to each other in order to form RF coil elements, e.g., loops, configured to receive MR signals.

FIG. 4 shows configurable RF coil assembly 300 in a first switching configuration 400. In the first switching configuration 400, configurable RF coil assembly 300 includes four effective RF coil elements. The four effective RF coil elements are each comprised of a set of electrically-coupled segments, where the segments are electrically coupled via selective coupling of terminals of a subset of the plurality of switches. A first RF coil element 402 is formed by coupling terminals of a first subset of the plurality of switches. For example, as shown, the first RF coil element 402 is formed by coupling both terminals of first switch 302 and by coupling two of three terminals of second switch 304, which causes first segment 202 to be electrically coupled to fifth segment 210 and to second segment 204. Likewise, two of three terminals of three-terminal node switches 404, 406, 416, and 418 are coupled. Two of four terminals of four-terminal node switches 408, 410, 412, and 414 are coupled. Thus, the first RF coil element 402 includes ten switches facilitating electrical coupling of ten segments. The ten segments are electrically coupled in a loop. Some switches, such as switch 420, do not have any coupled terminals and thus do not facilitate electrical coupling between segments. It is to be noted that in FIG. 4, segments that are included in an RF coil element (and thus electrically coupled to other segments) are shown in bold lines, while segments that are not included in an RF coil element (and thus are electrically decoupled from any other segments) are shown in non-bolded lines.

The remaining three RF coil elements are formed similarly to the first RF coil element, by coupling two terminals of each of a plurality of switches. The remaining three RF coil elements include a second RF coil element 422 (formed by coupling two terminals of each of 12 switches, electrically coupling 12 segments in a loop), a third RF coil element 424 (formed by coupling two terminals of each of 14; switches, electrically coupling 14 segments in a loop), and a fourth RF coil element 426 (formed by coupling two terminals of each of 12 switches, electrically coupling 12 segments in a loop).

The RF coil elements formed according to the configuration illustrated in FIG. 4 do not overlap. For example, first RF coil element 402 and second RF coil element 422 are spaced apart by a set of decoupled segments (e.g., a segment 428 coupled between switch 406 and a switch 430 is electrically decoupled and does not form a part of either first RF coil element 402 or second RF coil element 422, due to terminals of switch 406 and switch 430 that are coupled to segment 428 being open). Likewise, first RF coil element 402 is spaced apart from fourth RF coil element 426, second RF coil element 422 is spaced apart from third RF coil element 424, and third RF coil element 424 is spaced apart from fourth RF coil element 426. By configuring the configurable RF coil assembly 300 into a non-overlapping loop configuration as shown in FIG. 4, scanning speed may be increased (e.g., high acceleration), although the underlapped loop configuration may result in a shallower penetration into the imaging subject (e.g., smaller imaging depth).

Figure 5A:
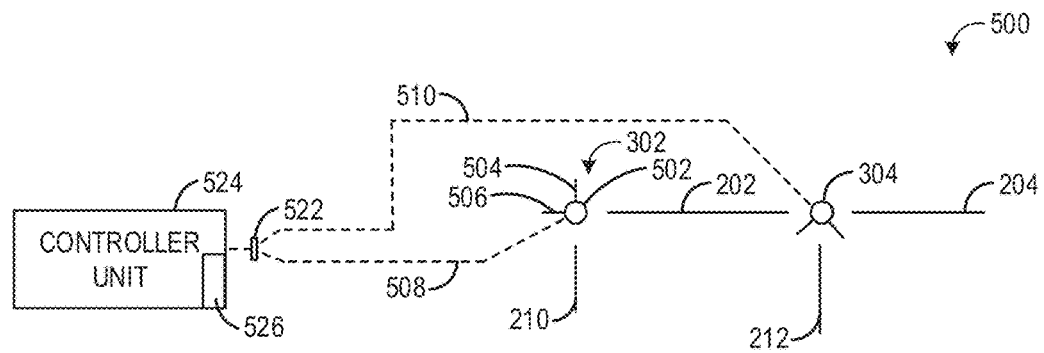
FIGS. 5A and 5B show magnified, detailed views of two switches of the configurable RF coil assembly of FIGS. 3 and 4 in different switching states.
Figure 5B:
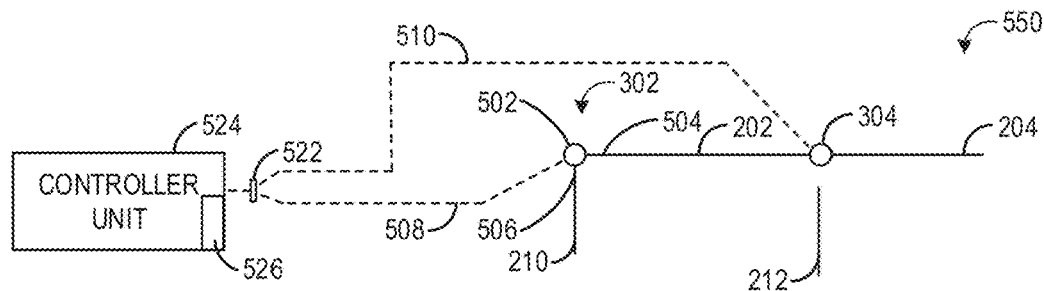

FIGS. 5A and 5B schematically show two exemplary switches from configurable RF coil assembly 300 (first switch 302 and second switch 304) in two different switching states. FIG. 5A shows the switches in a first state 500 where all the terminals to which the switches may couple are open. FIG. 5B shows the switches in a second state 550 where some of the terminals to which the switches may couple are closed in order to form an RF coil element (e.g., to form the first RF coil element 402 of FIG. 4). As used herein, a terminal may refer to a point of an electrically-conductive segment where the segment may contact an element of the switch (e.g., a beam, a hand, or other contact element) when the switch is in a particular configuration (e.g., when actuation voltage is applied to the switch, causing the element of the switch to contact the terminal). For example, if the switch includes hands, the terminals may be points of the segments that contact the hands. In other words, when a switch is actuated to a closed state, a terminal may be a point/location of the segment that contacts a hand of the switch and through which current may flow. The terminals, while located at the ends of the segments, may be referred to herein as being part of the switches or coupled to the switches, or at least configured to contact parts of the switches.

First switch 302 is a two-terminal node switch and thus only includes two switch states—coupled (closed) or decoupled (open). First switch 302 includes two hands, a first hand 504 and a second hand 506. First hand 504 and second hand 506 may be electrically coupled to each other via central portion 502. When first switch 302 is closed (as shown in FIG. 5B), first hand 504 may contact a terminal of first segment 202. When closed, second hand 506 may contact a terminal of fifth segment 210. When first switch 302 is open (as shown in FIG. 5A), first segment 202 is electrically disconnected from switch 302 and fifth segment 210 is electrically disconnected from switch 302. To control the position of first hand 504 and second hand 506, a first coil-interfacing cable 508 is coupled to first switch 302. Coil-interfacing cable 508 may be used to supply actuation voltage to the switch in order to move the hands to desired positions. For example, controller unit 524 may be configured to individually supply actuation voltage to each coil-interfacing cable of the configurable RF coil assembly so that each hand of each switch may be controlled to couple or uncouple respective segments.

In some examples, each of the coil-interfacing cables may be configured to transmit signals between a formed RF coil element and other aspects of the processing system (e.g., the controller unit 524). Accordingly, in such examples, each cable may be a 3-conductor triaxial cable having a center conductor, an inner shield, and an outer shield. In some embodiments, the center conductor is connected to the RF signal (RF), the inner shield is connected to ground (GND), and the outer shield is configured to supply the actuation voltage. Each coil-interfacing cable may have a high impedance for common mode. Because an RF coil element may be formed such that current flows through multiple switches, and hence multiple coil-interfacing cables may be electrically coupled to each formed RF coil element, controller unit 524 (or other element of the MRI processing system) may be configured to select one coil-interfacing cable per formed RF coil element for RF signal transmission, in order to prevent the RF signal received by the formed RF coil element from being transmitted to the controller unit 524 along multiple separate paths. In other examples, the RF signal may be transmitted along each coupled cable. The controller unit 524 may correspond to and/or be associated with the data processing unit 31 and/or controller unit 25 in FIG. 1.

The coil-interfacing cables discussed herein may be disposed within the bore or imaging space of the MRI apparatus (such as MRI apparatus 10 of FIG. 1) and subjected to electro-magnetic fields produced and used by the MRI apparatus. In MRI systems, coil-interfacing cables may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents. Thus, coil-interfacing cable 508 may include one or more baluns. In some embodiments, the one or more baluns may be continuous baluns, such as distributed, flutter, and/or butterfly baluns.

Second switch 304 is a three-terminal node switch and thus includes four possible positions—decoupled (open), a first coupled position (first closed position), and a second coupled position (second closed position), and a third coupled position (third closed position). Second switch 304 includes two hands electrically coupled to each other via a central portion, similar to first switch 302. When the switch is in the first closed position (as shown in FIG. 5B), the hands may contact a terminal of second segment 204 and a terminal of first segment 202 (at an end opposite the end of first segment 202 that contacts first hand 504), thereby coupling second segment 204 and first segment 202. When open (as shown in FIG. 5A), second segment 204, first segment 202, and sixth segment 212 are electrically disconnected from switch 304. The remaining closed positions include first segment 202 being coupled to sixth segment 212 and second segment 204 being coupled to sixth segment 212.

Second switch 304 is coupled to a coil-interfacing cable 510, which is similar to the coil-interfacing cable described above, and thus is configured to supply actuation voltage and may also include a ground line and an RF signal line. In some examples, each coil-interfacing cable may be coupled to controller unit 524 via a connector 522.

The controller unit 524 may include additional coupling electronics to amplify the signal(s) that are received by the RF coil elements. For example, the controller unit 524 may include a plurality of pre-amplifiers 526. Each pre-amplifier may be configured to couple to a formed RF coil element. In some embodiments, the configurable RF coil assembly may have a maximum number of RF coil elements that can be formed with the assembly, such as 16, 32, 64, etc., and the controller unit may include an equivalent number of pre-amplifiers. In some embodiments, the pre-amplifiers may not be physically housed in the controller unit, but may instead be housed in a box separate from but operably coupled to the controller unit.

FIG. 5A shows both switches (switch 302 and switch 304) in an open/disconnected position. As such, current does not flow along first segment 202, second segment 204, fifth segment 210, or sixth segment 212. Such a state may be employed during a transmit operation, when an RF transmit coil (such as body coil unit 15 of FIG. 1) is activated to generate an RF pulse. Opening all the switches may effectively decouple the configurable RF coil assembly during a transmit operation. Typically, the RF coil assembly in its receive mode may receive MR signals from a body of a subject being imaged by the MR apparatus. If the configurable RF coil assembly is not used for transmission, then it may be decoupled from the RF body coil while the RF body coil is transmitting the RF signal.

FIG. 5B shows a state where both switches are closed in order to couple a subset of the segments, such as when the first RF coil element 402 of FIG. 4 is formed. In the state shown in FIG. 5B, current may flow through first segment 202, second segment 204, and fifth segment 210. Current may not flow through sixth segment 212.

Figure 13:
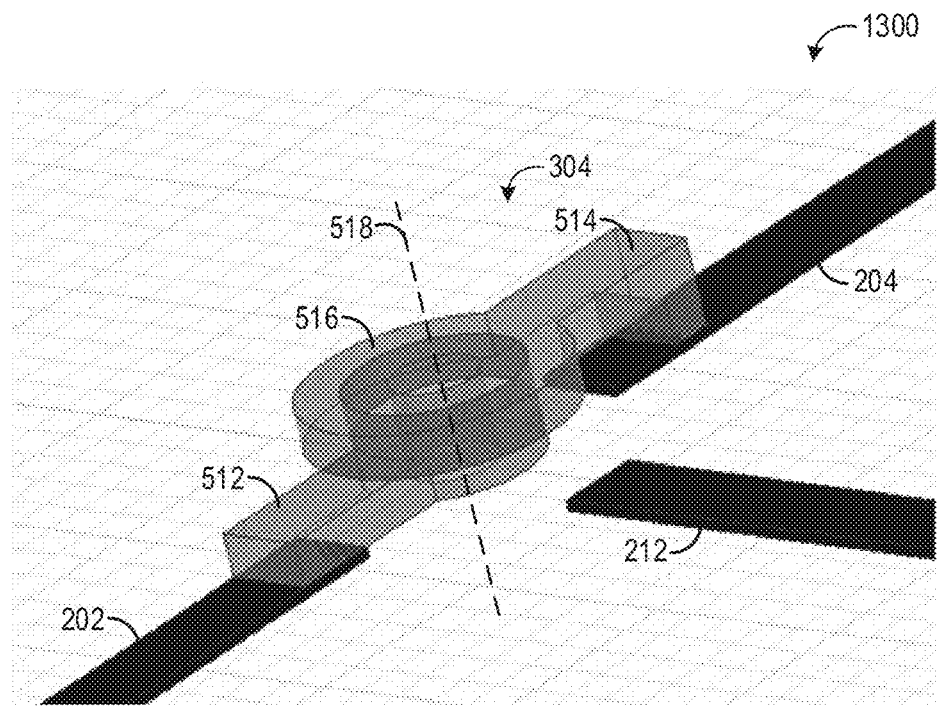
FIG. 13 shows a side view of a first example switch.

FIG. 13 shows a side view 1300 of second switch 304. Second switch 304 includes a first hand 512 and a second hand 514 electrically coupled via a central portion 516. First hand 512 is flat and has a bottom surface that lines along a same plane as the plane that the top surface of each segment extends across. In this way, first hand 512 includes a bottom surface that may contact a desired terminal/segment. Second hand 516 may be positioned in a plane vertically above the bottom surface of first hand 512, but may have an element that extends downward to the same plane as the top surfaces of the segments. In this way, second hand 514 may contact a desired terminal/segment via the bottom surface of the element. In the positions shown in FIG. 13, first hand 512 is coupled to a terminal of first segment 202 and second hand 514 is coupled to a terminal of second segment 204. Sixth segment 212 is decoupled. As appreciated from FIG. 13, each hand may be configured to rotate around a central axis 518. In some examples, each hand may rotate independently through a plurality of different angular positions. In other examples, the hands may rotate at least partially together. However, to provide for the four possible switching states of second switch 304, the positions of the hands are not fixed relative to each other.

In some embodiments, first hand 512 may rotate to a specified angular position based on an amount of current or voltage that is supplied to first hand 512. In some embodiments, first hand 512 may rotate to any angular position (e.g., within a level of tolerance, such as moving by 1 or 10 degree increments). In other embodiments, first hand 512 may only rotate to a subset of angular positions (e.g., 0°, 90°, 180°, 270°, and 360°). Likewise, second hand 514 may rotate to any angular position or may only rotate to a subset of angular positions.

While the switches illustrated in FIGS. 5A, 5B, and 13 have been described as including hands that rotate to facilitate coupling and decoupling, such a configuration is exemplary and other configurations are possible. For example, the switches may include a plurality of beams that are each in a fixed angular position, where the beams may move vertically (e.g., in and out of contact with a corresponding terminal) in response to an actuation voltage. In other examples, the switches may not be mechanically based (e.g., with hands or beams) and may instead be electronically-based switches.

Other switches in the configurable RF coil assembly 300 may be configured similarly to the switches illustrated in FIGS. 5A, 5B, and 13; the four-terminal node switches (e.g., switch 408) may include two hands that may be controlled via supply of an actuation voltage from a respective coil-interfacing cable. Further, the switches present in the configurable RF coil assembly and shown in FIGS. 5A and 5B may be suitable types of switches, such as micro-electromechanical system (MEMS) switches, field effect transistors (FETs), diodes, or other switches. However, given the high density of the number of switches (and number of terminals per switch) on the assembly, the switches may be low-power switches to prevent overheating and other issues that may arise with higher-power switches.

The two hand switches described above may be positioned to a number of different states, where the number of different states is based on the number of terminals that are couplable to the switch. For example, a two terminal node switch may have two states (decoupled and coupled) while a three terminal node switch may have four states (uncoupled, coupling a first and second terminal, coupling the first terminal and a third terminal, and coupling the second terminal and the third terminal). The switches connect two of n terminals through a triaxial cable to a switching driver, which may be included in the controller unit, for example. Based on the switch's state, the switch may connect to a terminal as an electrical short, also connecting to the triaxial cable, or the switch may disconnect from the terminals.

The configurable RF coil assembly presented above with respect to FIGS. 3 and 4 may be utilized in order to receive MR signals during an MR imaging session. As such, the configurable RF coil assembly of FIGS. 3 and 4 may be used in RF coil unit 14 of FIG. 1 and may be coupled to a downstream component of the MRI system, such as the controller unit 25. The configurable RF coil assembly may be placed in the bore of the MRI system in order to receive the MR signals during the imaging session, and thus may be in proximity to the transmit RF coil (e.g., the body RF coil unit 15 of FIG. 1). The controller unit may store instructions in non-transitory memory that are executable to generate an image from an imaging subject positioned in the bore of the MRI system during an MR imaging session. To generate the image, the controller unit may store instructions to perform a transmit phase of the MR imaging session. During the transmit phase, the controller unit may command (e.g., send signals) to activate the transmit RF coil(s) in order to transmit one or more RF pulses. To prevent interference leading to $B_1$ field distortion during the transmit phase, the configurable RF coil assembly may be decoupled during the transmit phase. The controller unit may store instructions executable to perform a subsequent receive phase of the MR imaging session. During the receive phase, the controller unit may obtain MR signals from the formed RF coil elements of the configurable RF coil assembly. The MR signals are usable to reconstruct the image of the imaging subject positioned in the bore of the MRI system.

As explained, a coil-interfacing cable extends between each switch and an RF coil interfacing connector (e.g., connector 522). Each of the electrical wires coupled to the switches may be housed together (e.g., bundled together) within the coil-interfacing cable and electrically coupled to the connector. The connector may interface with the MRI system (e.g., electrically couple with the MRI system by plugging into an input of the MRI system) in order to output signals from the RF coil elements to the MRI system, and the MRI system may process the signals received from the RF coil elements via the connector in order to produce images of an imaging subject, such as the body of a patient.

FIGS. 6-9 show a configurable RF coil assembly according to another embodiment of the disclosure. The configurable RF coil assembly shown in FIGS. 6-9 may be a first-order array that includes overlapping conductive segments. Such a configuration may allow for RF coil elements having more complex geometry than the zero-order array shown in FIG. 2, for example.

FIG. 6 is a schematic view of an array of RF coil segments 600. The array of RF coil segments 600 includes a plurality of segments that that form the basis of a configurable RF coil assembly (shown in FIG. 7). Each segment of the array of RF coil segments 600 is comprised of material configured to generate an MR signal during an imaging scan by being induced to generate an electric current when exposed to changes in magnetic flux. In some embodiments, each segment may be comprised of copper or other suitable conductor. In some embodiments, each segment may be comprised of at least two parallel conductors that form a distributed capacitance along the length of the loop portion, as explained above with respect to FIG. 2.

The plurality of segments are arranged into rows and columns. For example, a first row 601 includes eight segments that are aligned along a common axis (as shown, each segment in first row 601 is oriented horizontally so that a longitudinal axis of each segment is aligned along a common, horizontal axis). Each segment of first row 601, such as first segment 602, is equal in length and is spaced apart from neighboring segments in the row by an equal amount. The array of RF coil segments 600 includes seven rows, each row similar to first row 601.

The array of RF coil segments 600 includes a plurality of columns of segments, such as first column 603. Each column includes six segments oriented vertically and aligned along a common axis, such that a longitudinal axis of each segment of a given column is aligned along a common, vertical axis. Each segment of first column 603, such as second segment 604, is equal in length and is spaced apart from neighboring segments in the column by an equal amount. The array of RF coil segments 600 includes six columns, each column similar to first column 603.

The array of RF coil segments 600 further includes a plurality of overlapping segments, which are arranged in groups of two in a respective center of each rectangle formed by the segments in the columns and rows of segments. Each group of two segments is overlapped, forming an x-shape. For example, referring to FIG. 6, a third segment 606 and a fourth segment 608 form an overlapped, x-shaped group of two segments. The third segment 606 and fourth segment 608 overlap, but are not electrically connected. As shown in FIG. 6, the array of RF coil segments 600 includes eight columns of overlapped, x-shaped groups of two segments, with each column including six overlapped, x-shaped groups of two segments.

In this way, the segments of the array of RF coil segments 600 are arranged in a semi-overlapping manner, with some of the segments spaced apart and not touching any other segments of the array and other segments overlapping. Such a configuration may be referred to as a first-order array, which indicates that a first level of overlap among the segments is present. While not shown in FIG. 6, each segment of the array of RF coil segments 600 may be mounted on (e.g., glued, stitched, or otherwise coupled to) a suitable substrate. The substrate may be a flexible substrate (e.g., that is transparent to RF signals, such as one or more layers of Nomex® material or Nomex Nano® material) or rigid substrate (e.g., polycarbonate). In still further examples, the array of RF coil segments 600 may include segments formed from copper traces patterned onto a flexible substrate, such as polyimide.

It is to be understood that the number and arrangement of segments shown in FIG. 6 is exemplary, and other configurations are possible. For example, the array may have any number of rows and/or columns of segments, such as more or fewer than nine columns or more or fewer than seven rows. Further, while each segment is shown in FIG. 6 has having equal length and width and is spaced apart from neighboring segments in a similar manner, other configurations are possible, such as segments having different lengths. In still further examples, other orders of arrays of segments are possible, such as a second-order array of segments where a second layer of overlap among segments may be present, to provide even further options for RF coil element size and geometry. However, higher-order arrays may utilize switches with a higher number of terminals, which may be limited by cost, power requirements, etc.

In order to form one or more RF coil elements capable of receiving MR signals, each segment of the array of RF coil segments 600 is coupled to two switches. Each switch may be selectively couplable to at least three terminals that may be selectively opened and closed in order to form desired RF coil element geometries. FIG. 7 shows a configurable RF coil assembly 700 comprised of the array of RF coil segments 600 and a plurality of switches. In some embodiments, the configurable RF coil assembly 700 may be a surface receive coil, which may be single- or multi-channel. The configurable RF coil assembly 700 may be a non-limiting example of RF coil unit 14 of FIG. 1 and as such may operate at one or more frequencies in the MRI apparatus 10.

The plurality of switches may include a first set of three-terminal node switches, such as first switch 702, shown as triangles in FIG. 7. The plurality of switches may further include a second set of five-terminal node switches, such as second switch 704, shown as pentagons in FIG. 7. The plurality of switches may further include a third set of eight-terminal node switches, such as third switch 706, shown as hexagons in FIG. 7. Thus, each corner of the configurable RF coil assembly 700 includes a three-terminal node switch, each outer switch (other than the corner switches) is a five-terminal node switch, and each inner switch is an eight-terminal node switch.

Each segment is coupled to two switches. For example, first segment 602 is coupled to first switch 702 at a first end of first segment 602 and to second switch 704 at a second end of first segment 602. Each three-terminal node switch is configured to couple to two segments. For example, first switch 702 may couple two of first segment 602, second segment 604, and fourth segment 608 to each other. Each five-terminal node switch may couple two of five segments to each other. Each eight terminal node switch may be a 2×2 switch that includes two switches stacked on each other, with each switch configured to couple two of four (different) terminals to each other, which will be explained in more detail below.

As explained above with respect to FIGS. 5A and 5B, each switch is configured to selectively decouple and couple terminals from the switch. When a switch is in a closed position, a terminal coupled to a hand of the switch may allow current flow along the segment coupled to the terminal (assuming the circuit formed by the closing of the terminal is otherwise closed). Other terminals configured to couple to the switch that are not coupled to a hand of the switch may not flow current. When the switch is open, none of the terminals configured to couple to the switch may flow current along respective segments coupled to the terminals. By selectively coupling some terminals and not other terminals, different segments may be electrically coupled to each other in order to form RF coil elements, e.g., loops, configured to receive MR signals. Each three and five terminal node switch of configurable RF coil assembly 700 may be configured similarly to the switches described above with respect to FIGS. 5A and 5B, in that the switches include two hands that may electrically couple two (of three or five possible) terminals or decouple the (three or five) terminals from the switch. Each eight terminal node switch may include two separate switches, and will be described in more detail below. Each switch is individually controllable so that a desired set of RF coil elements may be formed, having desired geometry, desired size, etc.

FIG. 8A shows configurable RF coil assembly 700 in a first switching configuration 800. In the first switching configuration 800, configurable RF coil assembly 700 includes two effective RF coil elements. The two effective RF coil elements are each comprised of a set of electrically-coupled segments, where the segments are electrically coupled via selective coupling of a subset of terminals using the plurality of switches. The two RF coil elements overlap a field of view (FOV) 802, where the FOV extends only partially across the configurable RF coil assembly 700. Accordingly, only segments within the FOV are electrically connected, thereby limiting the extent of the RF coil elements to the FOV. Such a configuration may reduce or prevent image artifacts caused by the reception of signals outside of the FOV.

A first RF coil element 810 is formed by moving a first subset of the plurality of switches into respective closed/coupled positions. For example, as shown, the first RF coil element 810 is formed by coupling two terminals of each of a plurality of five-terminal node switches (herein, five five-terminal node switches in the center of the top row of switches), and by coupling two terminals of each of a plurality of eight-terminal node switches. As shown, the first RF coil element 810 includes 14 switches facilitating electrical coupling of 14 segments. The 14 segments are electrically coupled in a loop. Some switches in the configurable RF coil assembly 700 are fully decoupled and thus do not facilitate electrical coupling between segments. It is to be noted that in FIG. 8A, segments that are included in an RF coil element (and thus electrically coupled to other segments) are shown in bold lines, while segments that are not included in an RF coil element (and thus are electrically decoupled from any other segments) are shown in non-bolded lines.

Of the 14 switches that have coupled terminals to form the first RF coil element 810, six of the switches have terminals that are coupled to create a turn or corner in the RF coil element—two of the five-terminal node switches and four of the eight-terminal node switches. In particular, the first RF coil element 810 has a geometry similar to a rectangle with two snipped bottom corners, thereby creating a bottom side of the RF coil element that is shorter than the top side, and including two sloped edges. To facilitate this shape, some of the eight-terminal node switches couple terminal(s) of an overlapping segment. For example, first switch 804 couples a terminal of segment 806 to a terminal of segment 812 (which is an overlapping segment), which causes the first RF coil element 810 to be angled at first switch 804.

The remaining RF coil element (second RF coil element 820) is formed similarly to the first RF coil element, by coupling two terminals of each of a plurality of switches. The second RF coil element 820 includes 14 switches electrically coupling 14 segments in a loop, with a snipped rectangle shape similar to first RF coil element 810.

The RF coil elements formed according to the configuration illustrated in FIG. 8A overlap. For example, first RF coil element 810 and second RF coil element 820 include an overlapping region where a top of the second RF coil element 820 overlaps with a bottom of the first RF coil element 820. Two switches are common to the two formed RF coil element. For example, first switch 804 provides a first coupling between two terminals to facilitate electrical coupling of segment 806 and segment 812, to form first RF coil element 810. First switch 804 also provides a second coupling between two different terminals to facilitate electrical coupling of segment 808 and segment 810, to form second RF coil element 820. By configuring the configurable RF coil assembly 700 into an overlapping loop configuration as shown in FIG. 8A, scanning penetration may be increased, although the overlapped loop configuration may decrease scanning speed (e.g., low acceleration). Further, the configuration shown in FIG. 8A demonstrates that the size of the formed RF coil elements and/or number of formed RF coil elements may be selected to overlap an imaging FOV, reducing the extent of the RF coil elements that are outside the FOV.

Figure 8B:
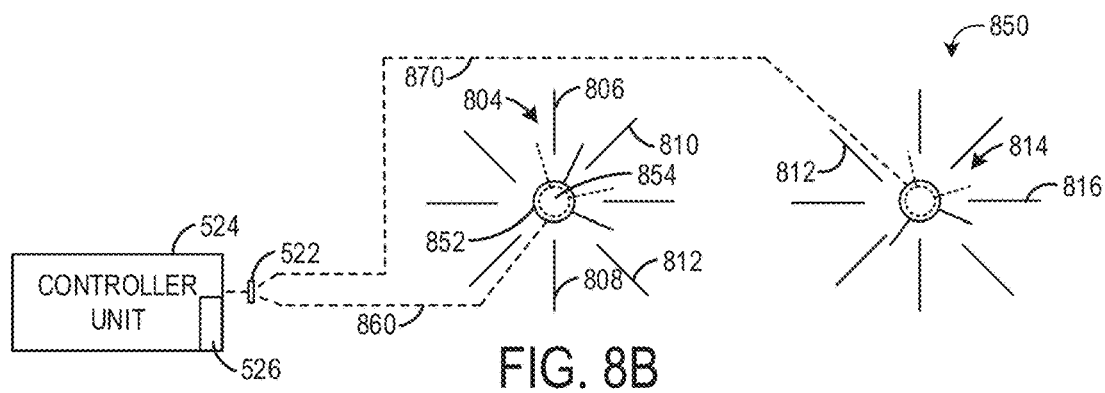
FIGS. 8B and 8C show magnified, detailed views of two switches of the configurable RF coil assembly of FIG. 7 in different switching states.
Figure 8C:
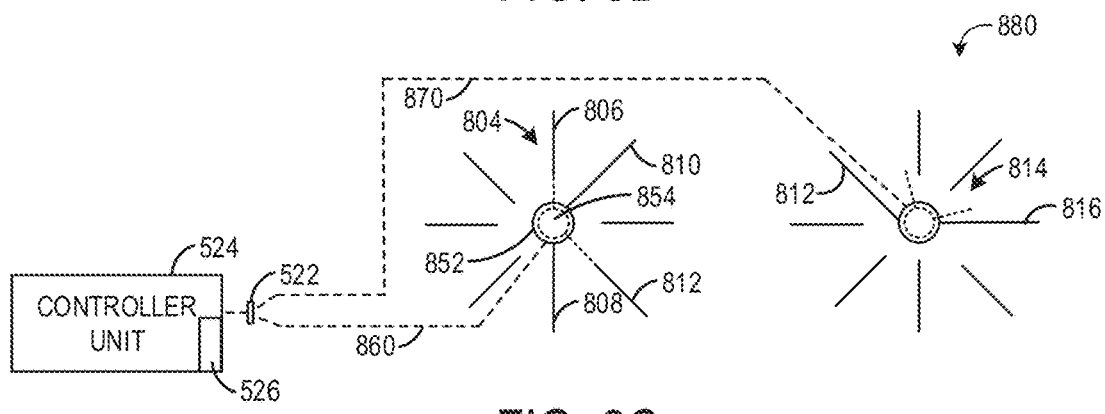

FIGS. 8B and 8C schematically show two exemplary switches from configurable RF coil assembly 700 (first switch 804 and a second switch 814) in two different switching states. FIG. 8B shows the switches in a first state 850 where the switches are fully decoupled so that all the terminals to which the switches may couple are decoupled. FIG. 8C shows the switches in a second state 880 where a subset of terminals from each switch are coupled to each other in order to form an RF coil element (e.g., to form the first RF coil element 810 of FIG. 8A). Referring first to FIG. 8B, first switch 804 and second switch 814 are each open, fully decoupling all terminals associated with each switch. First switch 804 and second switch 814 are each 2×2 switches comprised of two overlapping and individually controlled sub-switches. For example, referring to first switch 804, it includes a first sub-switch 852 that includes two hands electrically coupled via a central portion, similar to switch 302 described above. First switch 804 further includes a second sub-switch 854 that is positioned on first sub-switch 852. First sub-switch 852 is shown in solid lines while second sub-switch 854 is shown in dashed lines to enhance visual clarity and differentiation. Second sub-switch 854 includes two hands electrically coupled via a central portion. First sub-switch 852 and second sub-switch 854 are not coupled to each other electrically and are controlled individually, such that first sub-switch 852 may facilitate coupling of two terminals (or not) while second sub-switch 854 may facilitate coupling of two different terminals (or not), allowing no, two, or four terminals to be coupled via first switch 804. As shown in FIG. 8B, each of first sub-switch 852 and second sub-switch 854 are decoupled (e.g., in a position where the hands are not contacting terminals) and no terminals are electrically coupled via first switch 804. Likewise, second switch 814 includes two sub-switches each having two hands, and in FIG. 8B, both sub-switches are decoupled and no terminals are electrically coupled via second switch 814. First switch 804 is coupled to downstream components (e.g., controller unit 524) via a coil-interfacing cable 860 and second switch 814 is coupled to downstream components (e.g., controller unit 524) via coil-interfacing cable 870. The coil-interfacing cables 860, 870 are similar to the coil-interfacing cables described above with respect to FIG. 5A.

FIG. 8C shows first switch 804 and second switch 814 in a second state 880, where the switches are facilitating electrical connection between terminals to form the RF coil elements shown in FIG. 8A. The position of the hands of both the first sub-switch 852 and the second sub-switch 854 have been moved in order to couple two sets of two terminals. The hands of first sub-switch 852 have been adjusted to couple segment 806 and segment 812. The hands of second sub-switch 854 have been adjusted to couple segment 808 and segment 810. In contrast, only the positions of the hands of one of the sub-switches of second switch 814 have been adjusted, in order to couple segment 812 to segment 816. The hands of the other sub-switch of second switch 814 are decoupled from any terminals.

Figure 14:
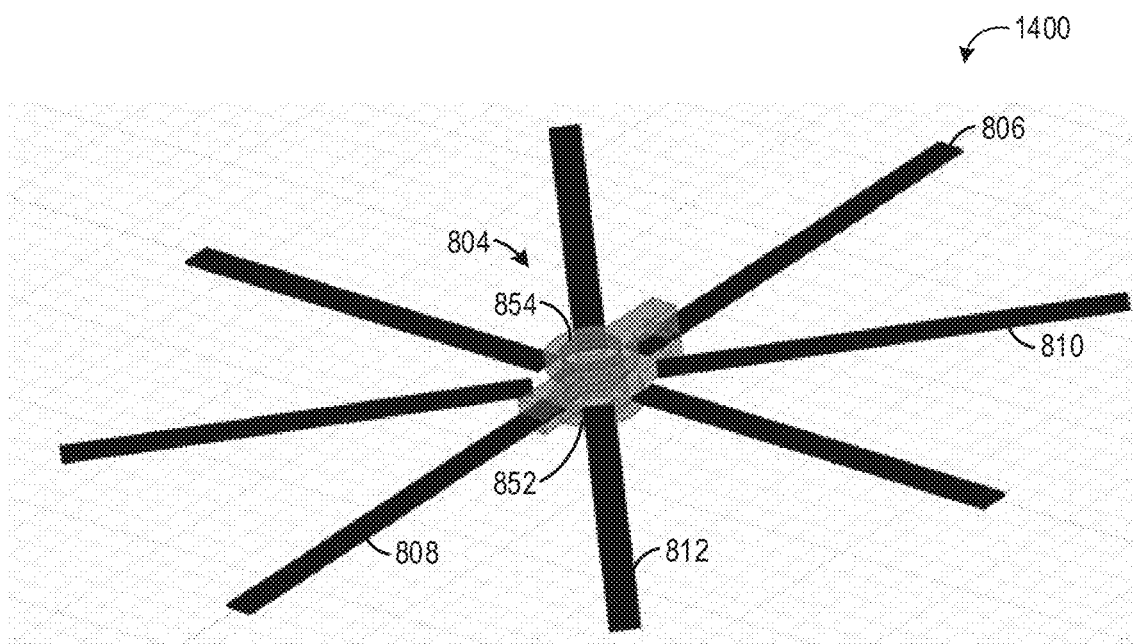
FIG. 14 shows a side view of a second example switch.

FIG. 14 shows a side view 1400 of first switch 804. First switch 804 includes the two sub-switches, first sub-switch 852 and second sub-switch 854. Each sub-switch includes a first hand and a second hand electrically coupled via a central portion. As explained above with respect to FIG. 13, each hand may have at least a portion (e.g., an element that extends downward from the hand, or a bottom surface of the hand) that is configured to contact a respective terminal. In FIG. 14, first sub-switch 852 and second sub-switch 854 are in the same position, such that each sub-switch has a first hand contacting a terminal of segment 806 and each sub-switch has a second hand contacting a terminal of segment 808. The remaining six segments are decoupled. As explained above with respect to FIG. 13, each hand may be configured to rotate around a central axis. In some examples, each hand may rotate independently through a plurality of different angular positions. In other examples, the hands may rotate at least partially together. However, to provide for the plurality of possible switching states of first switch 804, the positions of the hands are not fixed relative to each other.

In some embodiments, each hand may rotate to specified angular positions based on an amount of current or voltage that is supplied to that hand. In some embodiments, each hand may rotate to any angular position (e.g., within a level of tolerance, such as moving by 1 or 10 degree increments). In other embodiments, each hand may only rotate to a subset of angular positions (e.g., 0°, 45°, 90°, 135°, 180°, 225°, 270°, 315°, and 360°).

FIG. 9 shows configurable RF coil assembly 700 in a second switching configuration 900. In the second switching configuration 900, configurable RF coil assembly 700 includes four effective RF coil elements. The four effective RF coil elements are each comprised of a set of electrically-coupled segments, where the segments are electrically coupled via selective coupling of terminals of a subset of the plurality of switches. The four RF coil elements overlap a FOV 901 that extends across the entirety of the configurable RF coil assembly 700.

A first RF coil element 910 is formed by coupling terminals of a first subset of the plurality of switches. For example, as shown, the first RF coil element 910 is formed by coupling two terminals of a three-terminal switch (e.g., at the top left corner), two terminals of each of a plurality of five-terminal switches, and two terminals of each of a plurality of eight-terminal switches. As shown, the first RF coil element 910 includes 14 switches facilitating electrical coupling of 14 segments. The 14 segments are electrically coupled in a loop. Some switches in the configurable RF coil assembly 700 do not have any coupled terminals and thus do not facilitate electrical coupling between segments. It is to be noted that in FIG. 9, segments that are included in an RF coil element (and thus electrically coupled to other segments) are shown in bold lines, while segments that are not included in an RF coil element (and thus are electrically decoupled from any other segments) are shown in non-bolded lines.

Of the 14 switches that have coupled terminals to form the first RF coil element 910, six of the switches have terminals that are coupled to create a turn or corner in the RF coil element to create a geometry similar to a rectangle with two snipped bottom corners, thereby creating a bottom side of the RF coil element that is shorter than the top side, and including two sloped edges. To facilitate this shape, some of the switches have terminals that are coupled to an overlapping segment (when the terminals are closed).

The remaining RF coil elements are formed similarly to the first RF coil element, by coupling two terminals of each of a plurality of switches. A second RF coil element 920 includes 14 switches electrically coupling 14 segments in a loop, with a rectangular shape. A third RF coil element 930 includes 16 switches electrically coupling 16 segments in a loop, with a snipped rectangle shape. A fourth RF coil element 940 includes 12 switches electrically coupling 12 segments in a loop, with a snipped rectangle shape.

The RF coil elements formed according to the configuration illustrated in FIG. 9 overlap. For example, first RF coil element 910 and fourth RF coil element 940 include an overlapping region where a top of the fourth RF coil element 940 overlaps with a bottom of the first RF coil element 910. The first RF coil element 910 also overlaps the second RF coil element 920, but with the first and second RF coil elements actually relying on the same segments to form a portion of the coil elements. For example, switch 902 has three terminals closed, which electrically couples segment 904 to both segment 906 and segment 908. Three segments are common to both the first and second RF coil elements, segment 904 as well as segment 912 and segment 914. Third RF coil element 930 and fourth RF coil element 940 also share a segment, segment 916.

By configuring the configurable RF coil assembly 700 into an-overlapping loop configuration as shown in FIG. 9, scanning penetration may be increased, although the overlapped loop configuration may decrease scanning speed (e.g., low acceleration). Further, the configuration shown in FIG. 9 demonstrates that the size of the formed RF coil elements and/or number of formed RF coil elements may be selected to overlap an imaging FOV.

In this way, a single RF coil assembly may be used to provide multiple, different RF coil configurations, also referred to herein as contour topologies. By doing so, different FOVs may be imaged with one RF coil assembly. Likewise, one RF coil assembly may be used to perform different scans that have different scan/image quality priorities, such as SNR, acceleration, image penetration, etc., which often rely on different RF coil element configurations (e.g., different coil element overlap, different coil element size, different coil numbers, etc.). By providing an array of conductive segments that may be selectively electrically coupled in different loop formations, and also selectively decoupled, via a plurality of switches, the different RF coil element configurations may be provided from scan session to scan session.

For example, during a first MRI scan of a first patient, a first contour topology may be selected that defines a first set of RF coil elements that includes a first RF coil element. To form the first set of RF coil elements, some or all switches may be selectively activated to electrically couple one or more respective first subsets of conductive segments into RF coil elements. For example, to form the first RF coil element, a first subset of switches may be activated (e.g., where at least one terminal is closed) to electrically couple a first subset of conductive segments.

Then, during a second MRI scan of a second, different patient, a second, different contour topology may be selected that defines a second set of RF coil elements that includes a second, different RF coil element. To form the second set of RF coil elements, some or all switches may be selectively activated to electrically couple one or more respective second subsets of conductive segments into RF coil elements. For example, to form the second RF coil element, a second subset of switches may be activated (e.g., where at least one terminal is closed) to electrically couple a second subset of conductive segments.

The first and second RF coil elements may differ in size, geometry, and/or other features. For example, the first RF coil element may include 12 conductive segments while the second RF coil element may include 14 conductive segments, causing the second RF coil element to have a larger diameter than the first RF coil element. In another example, the first RF coil element may be a standard rectangle shape, while the second RF coil element may be a clipped rectangle as described above.

In some embodiments, the first RF coil element and second RF coil element may be comprised of at least some of the same conductive segments. For example, referring to FIGS. 8A and 9, FIG. 8A includes first RF coil element 810 and FIG. 9 includes second RF coil element 920. First RF coil element 810 is shaped as a clipped rectangle, while second RF coil element 920 is shaped as a regular rectangle. Additionally, some of the conductive segments that form first RF coil element 810 are also included in second RF coil element 920. For example, segment 906 is included in both RF coil elements.

FIG. 10 shows another schematic view 1000 of configurable RF coil assembly 700. In view 1000, only a portion of configurable RF coil assembly 700 is shown for visual purposes. The switches are represented by arrowed lines, with each arrowed line representing a hand of a switch. When aligned with a corresponding segment, that switch is coupled to the segment. For example, switch 702 is coupling segment 602 and segment 604. The eight terminal node switches have two overlapping sub-switches, shown with two sets of two arrowed hands. Each switch is coupled to a respective coil-interfacing cable. Only a subset of coil-interfacing cables is shown for clarity, but it is to be understood that all switches are coupled to a respective coil-interfacing cable.

As described above, the coil-interfacing cables may connect to a downstream component of the MRI system. As shown in FIG. 10, the downstream components may include controller boards. The controller boards drive the configurable RF coil assembly, including the switches, and extract and channel the signals to the MRI system. In some examples, only one controller board may be needed for the entire configurable RF coil assembly. In such examples, each cable of the assembly may be coupled to the controller board.

However, in some examples, depending on the density of the assembly, more than controller board may be used. FIG. 10 includes two controller boards, a first controller board 1002 and a second controller board 1013. In some embodiments, configurable RF coil assembly 700 may connect to four controller boards, and thus only a subset of the controller boards are shown in FIG. 10. For example, assembly 700 may be divided into quadrants, and each quadrant may be coupled to a different controller board. As shown in FIG. 10, the top left quadrant may be coupled to controller board 1002 while the bottom left quadrant may be coupled to controller board 1013. Each switch of the top quadrant may be coupled to controller board 1002 via a respective cable and each switch of the bottom quadrant may be coupled to controller board 1013 via a respective cable (only a portion of the cables are shown so that underlying elements may be viewed).

First controller board 1002 includes a first switching driver 1004 and four feedboards (feedboards 1006, 1008, 1010, and 1012). Each switch of a subset of the switches of the configurable RF coil assembly 700 (each switch of the top left quadrant) is connected through a respective coil-interfacing cable to the switching driver 1004. The switching driver 1004 controls each switch's hands' direction and contact with terminals. Second controller board 1013 includes a second switching driver 1014 and four feedboards (feedboards 1016, 1018, 1020, and 1022). Each switch of a subset of the switches of the configurable RF coil assembly 700 (e.g., each switch of the bottom left quadrant) is connected through a respective coil-interfacing cable to the switching driver 1014. The switching driver 1014 controls each switch's hands' direction and contact with terminals.

As will be explained in more detail below, a contour topology assistant may select a switching matrix that dictates the position of the hands of each switch, thereby selecting which segments will be electrically coupled in order to form a desired set of RF coil elements. The contour topology assistant may also select how many signal channels are to be generated and which switches are to be connected to the available feedboards. The feedboards may include preamplifiers and/or other coupling electronics and may output the MR (e.g., RF) signals that are obtained with the formed RF coil elements to one or more components of the MRI system. The one or more components of the MRI system may then reconstruct an image based on the received MR signals. As shown in FIG. 10, one RF coil element is formed on the top left quadrant, and thus only one signal channel is generated via controller board 1002 (via feedboard 1006). Likewise, one RF coil element is formed on the bottom left quadrant, and thus only signal channel is generated via controller board 1013 (via feedboard 1016). Each switching driver may be operably coupled to one or more components of the MRI system, such as controller unit 25 and/or contour topology assistant 100, in order to receive the selected switching matrix, for example. In this way, with four controller boards each having four feedboards, the configurable RF coil assembly 700 may be a 16 channel assembly, though other configurations are possible.

In some embodiments, the MRI system described herein may store instructions executable by a processor (e.g., via controller unit 25) to select a contour topology for operating a configurable radio frequency (RF) coil assembly in a receive mode of the MRI system, the contour topology defining a configuration of one or more RF coil elements formed on the configurable RF coil assembly. The instructions may be executable to determine a switching matrix based on the selected contour topology, the switching matrix defining one or more subsets of switches of a plurality of switches of the configurable RF coil assembly to be at least partially activated during the receive mode to form the one or more RF coil elements. In such a configuration, the switching matrix may be output to one or more downstream components, such as the controller broads described above with respect to FIG. 10. The controller boards may activate/deactivate the switches as defined by the switching matrix. For example, the switching matrix may define, and thus the controller boards may activate the switches accordingly, so that at least two terminals of each switch of the one or more subsets of switches are electrically coupled to one or more subsets of conductive segments of the configurable RF coil assembly to form the RF coil elements, wherein each RF coil element is formed from a respective subset of conductive segments and a respective subset of switches. The contour topology may be selected based on patient information of a patient to be imaged with the MRI system, a scanning protocol defining aspects of the MRI system during imaging of the patient, and/or target image quality parameters of one or more images to be obtained with the MRI system. The switching matrix may further define, and the controller boards may further deactivate the switches accordingly, so that during a transmit mode of the MRI system, each switch of the plurality of switches is deactivated to decouple the configurable RF coil assembly.

FIG. 11 is a flow chart illustrating a method 1100 for performing an MRI scan using a configurable RF coil assembly, such as the configurable RF coil assembly 300 of FIG. 3, or the configurable RF coil assembly 700 of FIG. 7. Method 1100 may be executed by a processor of a computing device of an MRI system, such as controller unit 25, according to instructions stored in non-transitory memory of the computing device.

At 1102, patient information and scanning protocol are received. For example, an operator of the MRI system may input a patient identifier, such as a code or the patient's name, and/or the operator may input select information about the patient (e.g., date of birth, age, gender, body weight). Further, the operator may select a predetermined scanning protocol from a menu or the operator may input various scanning parameters to set the scanning protocol. The scanning protocol may indicate the anatomy to be scanned, diagnostic goal of the scan, and/or other parameters that the MRI system may use to identify table position, which receive RF coil assemblies are to be used during the scan (e.g., a head and neck RF coil assembly, posterior RF coil assembly, and/or anterior RF coil assembly), which contour topology to use (when the RF coil assemblies include a configurable RF coil assembly that may form different RF coil element contour topologies), and other scanning parameters. In particular, the operator may select the protocol based on the anatomy that is going to be scanned. By selecting a protocol, a field of view (FOV) may be determined correspondingly. The FOV defines a three-dimensional volume of the patient. In one example, the FOV defines the volume that is going to be scanned. For example, in cardiac imaging, the FOV is a cube with 20 cm long edges to cover the entire heart. In some examples, the FOV may include an entirety of the imaging subject/MRI bore volume that the MRI system is capable of imaging without moving the table on which the imaging subject is placed.

At 1104, a selection of a region of interest (ROI) is received. In some examples, the FOV may serve as the ROI, and no additional ROI may be selected. In other examples, an operator may wish to narrow a scanning region to a ROI that is smaller than the FOV. In some embodiments, a localizer scan may be performed upon receiving the patient information and scanning protocol, where the localizer scan may be a low resolution scan of the FOV. Herein, the low resolution scan is a scan with large voxel volume, which can be completed with reduced measurement time. The localizer scan may be performed using the body RF coil in a receive mode, which may enable reception of MR signals across a large area. In other examples, the localizer scan may be performed with one or more configurable surface RF coil assemblies in a localizer mode, where a default configuration of RF coil elements may be set. In one example, the image data acquired during the localizer scan may be used to reconstruct an MR image of the FOV. The localizer scan may generate three 2D images of the subject, for example, in the sagittal, coronal, and the transverse planes. Upon viewing the images obtained with the localizer scan, the operator may enter an input selecting a ROI.

At 1106, a contour topology is determined using a contour topology model. The contour topology model may utilize the FOV and/or ROI as well as patient information and the scanning protocol as inputs to determine a contour topology of a configurable RF coil assembly that will provide desired image/scan quality parameters. For example, the scanning protocol may include designation of certain scanning priorities, such as to prioritize SNR, prioritize scan speed, and/or prioritize imaging depth. Along with the designated priorities, the target anatomy being scanned and patient information (e.g., patient height and weight) may be used by the contour topology model to determine what configuration of RF coil elements are to be used to receive MR signals during the main imaging scan. In some embodiments, the MRI system stores a predefined look-up table which associates scanning protocols with corresponding contour topology of coil. In some embodiments, the contour topology model may be executed by a contour topology assistant, as will be explained in more detail below with respect to FIG. 12.

At 1108, a switching matrix that will generate the contour topology is determined. The switching matrix dictates which terminals of which switches of the configurable RF coil assembly are to be decoupled and which terminals of which switches of the configurable RF coil assembly are to be coupled during receive mode, in order to form the contour topology (e.g., the RF coil elements) designated by the contour topology model. In some embodiments, the MRI system stores a predefined look-up table which associates contour topologies with corresponding switching matrixes. In some embodiments, the contour topology model may output which RF coil elements are to be formed (e.g., number of elements, element geometry, size of elements, and position of elements), and method 1100 may determine which segments of the configurable RF coil assembly are to be electrically coupled to each other, in order to form the designated RF coil elements, and hence which terminals are to be decoupled and which terminals are to be coupled. In some embodiments, the contour topology model may output a switching matrix that will generate the designated contour topology (e.g., RF coil elements).

For example, the contour topology assistant may output a switching vector in the form of $[s_1\ s_2\ s_3\ s_4\ s_5 \ldots s_n]$ where $s_i$ is a state of the switch. As explained above, each switch may have two or more states, depending on the number of terminals to which the switch may couple. Further, as explained above, the contour topology assistant may also output the number of signal channels that are to be generated, which may also be in the form of a vector (referred to as an array configuration vector).

At 1110, a main scan is performed. The main scan is a high resolution 3D scan to generate high quality images of the ROI. The main scan has a lower voxel volume than the localizer scan, for example. During the main scan, the MRI apparatus may operate with a series of pulse sequences, where the pulse sequences include, among other elements, a transmit mode followed by a receive mode. As explained above, the receive RF coil elements may be decoupled during each transmit mode. Thus, as indicated at 1112, performing the main scan may include deactivating (decoupling) all switches of the configurable RF coil assembly during each transmit mode. During the receive mode, MR signals are received from the formed RF coil elements designated by the contour topology model. Thus, as indicated at 1114, performing the main scan may include activating one or more switches of the configurable RF coil assembly according to the switching matrix. It is to be understood that activating the switches may include coupling two or more terminals of the activated switches. During the receive mode, MR signals are received from only the segments included in the formed RF coil elements and are not received from any RF coil assembly segments not included in the selected RF coil elements. In other words, the segments other than the segments forming the RF coil elements are turned off (e.g., electrically decoupled) during the main scan, during both the transmit mode and the receive mode.

At 1116, one or more images are reconstructed from the MR signals obtained during the main scan. The one or more images may be displayed on a display unit and/or saved in memory (memory of the MRI apparatus and/or a remote device, such as a hospital picture archive and communication system (PACS)). At 1118, feedback may optionally be generated for the contour topology model. As will be explained in more detail below with respect to FIG. 12, a contour topology assistant may execute a model that is trained to select a contour topology for a configurable RF coil assembly (e.g., where the contour topology is the RF coil element configuration, including size, number, position, overlap, etc., of the RF coil elements formed on the configurable RF coil assembly) based on various inputs, including but not limited to the scanning protocol and patient information. After the contour topology model has been trained and is executed to select contour topologies for MRI scans, the contour topology assistant may continue to learn optimal contour topologies for the various inputs if feedback is provided to the contour topology assistant. Thus, in some embodiments, feedback may be generated and sent to the contour topology assistant, or feedback may be generated and used by the controller unit directly to update the contour topology model. The feedback may include the scanning protocol and patient information for the current scan, the RF coil element configuration for the current scan, and image/scan quality parameters for the current scan, including but not limited to SNR, detected image artifacts, imaging depth, imaging acceleration, etc. Method 1100 then ends.

Thus, method 1100 selectively couples and decouples terminals of switches of a configurable RF coil assembly in order to form a selected RF coil element configuration. The RF coil element configuration may be selected according to a trained contour topology model based on a scanning protocol, which may indicate the anatomy being scanned, the goal of the scan, desired quality parameters to prioritize, and other parameters, as well as patient parameters such as patient size. However, in some embodiments, other mechanisms may be utilized to select the RF coil element configuration. For example, an operator may select a desired RF coil element configuration. In another example, the scanning protocol may include a desired RF coil element configuration.

FIG. 12 is a flow chart illustrating a method 1200 for training and executing a contour topology model via a contour topology assistant, such as contour topology assistant 100 of FIG. 1. Method 1200 may be executed by a processor of a computing device according to instructions stored on a non-transitory memory of the device (such as processor(s) and memory of controller unit 25 shown in FIG. 1 or processor(s) and memory of a device in communication with controller unit 25 of FIG. 1, such as a central server). At 1202, a plurality of training datasets are received. A suitable number of training datasets may be received, such as 200 or 500 training datasets. Each training dataset may include a contour topology of an RF coil assembly used to obtain a respective MR image, as indicated at 1204. The contour topology may be the RF coil element configuration of the RF coil assembly, including the number of RF coil elements, the size of each RF coil element, the overlap among the RF coil elements, and the geometry of each RF coil element. It is to be appreciated that the contour topology for the respective MR image that is included as part of the training dataset may be a contour topology for a configurable RF coil assembly, as described herein, or it may be a contour topology for a standard, fixed element RF coil assembly.

Each training dataset may further include image parameters for the respective MR image, as indicated at 1206. The image parameters may include image/scan quality parameters, such as SNR, image uniformity, scanning acceleration, image artifacts, imaging depth, and so forth. Each training dataset may further include scan parameters for the respective MR image. The scan parameters may include target anatomy, FOV, patient information, diagnostic goal of the scan, and/or other parameters. Accordingly, the contour topology model may be trained using different image "outcomes" in order to be able to determine a contour topology that may be used for a specific patient (e.g., having specific patient parameters) during a specific MRI scan (e.g., that may have specific scanning parameters, including outcomes to prioritize), where the outcomes may include SNR, uniformity, artifacts, acceleration, imaging depth, or other parameters that may affect a final MR image.

At 1210, a contour topology model is generated based on the training datasets. The contour topology model may take on a suitable form depending on the method of machine learning being performed. For example, if the contour topology assistant is trained using a random forest learning algorithm, the contour topology model may include decision trees. In another example, if the contour topology assistant is trained using artificial neural networks, the contour topology model may include layers of connected artificial neurons. The contour topology model may be configured to output a contour topology (e.g., which may be a number, size, overlap, and geometry of one or more RF coil elements) when patient parameters (such as patient size) and scanning parameters (such as prioritized image/scan quality parameters, target anatomy, and FOV) are entered as inputs to the contour topology model.

At 1212, a contour topology is output based on received patient information, scanning protocol, and/or ROI or FOV, when requested by a user or another computing device in communication with the contour topology model. For example, a contour topology may be requested by controller unit 25 during execution of method 1100 of FIG. 11. The contour topology assistant may receive the current patient parameters and scanning protocol from controller unit 25 and enter aspects of the current patient parameters and scanning protocol as inputs to the contour topology model. The contour topology assistant may then send the output from the contour topology model (e.g., the contour topology) to controller unit 25. In some embodiments, the contour topology model may output an RF coil element configuration that may be utilized by the controller unit 25 to determine a switching matrix (e.g., which terminals of which switches to couple during receive mode). In other embodiments, the contour topology model may output the switching matrix to the controller unit 25.

At 1214, the contour topology model may be adjusted based on received feedback. As explained above with respect to FIG. 11, upon performing a main scan, the controller unit 25 may send feedback to the contour topology assistant, where the feedback may include the actual image/scan quality parameters for one or more images obtained during the MR scan with the configurable RF coil assembly in the selected RF coil element configuration. The contour topology assistant may learn from the feedback by making changes to the contour topology model. For example, if the SNR of the one more images was lower than desired, the contour topology model may be adjusted to lower the association of that RF coil element configuration with a high SNR. Method 1200 then ends.

A technical effect of utilizing a configurable RF coil assembly is that different RF coil element configurations may be generated with a single RF coil assembly, improving image quality parameters from scan to scan of different patients and different anatomies while lowering costs. Another technical effect of utilizing the configurable RF coil assembly is the ability to learn, over time, which RF coil element configurations may provide desired image/scan quality parameters, so that imaging quality may be improved.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI), the method comprising:
selecting a contour topology for operating a configurable radio frequency (RF) coil assembly, wherein the configurable RF coil assembly includes an array of conductive segments coupled via a plurality of switches that includes at least three switches each controllable by a separate control signal, and the contour topology defines a configuration of one or more RF coil elements formed on the configurable RF coil assembly; and
during a receive mode, at least partially activating one or more subsets of switches of the plurality of switches according to the selected contour topology to form the one or more RF coil elements;
wherein each conductive segment comprises two conductors that, when current flows through the two conductors, exhibit distributed capacitance that includes a capacitance between the two conductors that distributes along a length of the two conductors.

2. The method of claim 1, wherein at least partially activating the one or more subsets of switches includes coupling at least two terminals of each switch of the one or more subsets of switches to electrically couple one or more subsets of the conductive segments, wherein each RF coil element is formed from a respective subset of conductive segments and a respective subset of switches, each respective subset of conductive segments including at least four conductive elements and each respective subset of switches including at least four switches.

3. The method of claim 1, wherein selecting the contour topology comprises, during a first MM scan, selecting a first contour topology and during a second MRI scan, selecting a second contour topology different than the first contour topology.

4. The method of claim 3, wherein the first contour topology and the second contour topology differ in a total number of RF coil elements.

5. The method of claim 3, further comprising:
during the first MM scan, coupling at least two terminals of each switch of a first subset of switches of the plurality of switches to electrically couple a first subset of conductive segments of the array of conductive segments, thereby forming a first RF coil element; and
during the second MM scan, coupling at least two terminals of each switch of a second subset of switches of the plurality of switches to electrically couple a second subset of conductive segments of the array of conductive segments, thereby forming a second RF coil element,
wherein the first RF coil element and the second RF coil element differ in size and/or geometry.

6. The method of claim 5, wherein a portion of the conductive segments of the first subset of conductive segments are included in the second subset of conductive segments.

7. The method of claim 1, wherein selecting the contour topology comprises selecting a contour topology based on patient information of a patient to be imaged, a scanning protocol for imaging of the patient, and/or target image quality parameters of one or more images to be obtained.

8. The method of claim 7, wherein selecting the contour topology comprises applying a contour topology model that selects the contour topology based on the patient information, the scanning protocol, and/or the target image quality parameters, the contour topology model trained to correlate the selected contour topology with the target image quality parameters.

9. The method of claim 1, further comprising:
during a transmit mode of the MRI system, deactivating each switch of the plurality of switches to decouple the configurable RF coil assembly; and
reconstructing an image from MR signals obtained by the one or more RF coil elements.

10. A radio frequency (RF) coil assembly for a magnetic resonance imaging (MRI) system, comprising:
- an array of conductive segments each comprising two conductors that, when current flows through the two conductors, exhibit distributed capacitance that includes a capacitance between the two conductors that distributes along a length of the two conductors; and
- a plurality of switches, each switch coupled to at least two conductive segments of the array of conductive segments, the plurality of switches selectively activatable in order to form a plurality of different RF coil element configurations.

11. The RF coil assembly of claim 10, wherein each switch includes at least two terminals and at least two hands configured to rotate around a central axis by an amount based on an amount of supplied current or voltage, and wherein when a respective switch is activated, two or more terminals of the respective switch are coupled via two or more of the at least two hands of that switch, thereby electrically coupling at least two different conductive segments.

12. The RF coil assembly of claim 10, wherein the array of conductive segments comprises a plurality of non-overlapping conductive segments arranged into a plurality of rows and a plurality of columns.

13. The RF coil assembly of claim 12, wherein the plurality of switches includes a first subset of switches, a second subset of switches, and a third subset of switches, the first subset of switches each coupled to two respective conductive segments, the second subset of switches each coupled to three respective conductive segments, and the third subset of switches each coupled to four respective conductive segments.

14. The RF coil assembly of claim 12, wherein the array of conductive segments further includes a plurality of conductive segments arranged into groups of two overlapping conductive segments, each group of two overlapping conductive segments positioned in a center of respective rectangle formed by the plurality of non-overlapping conductive segments.

15. The RF coil assembly of claim 14, wherein the plurality of switches includes a first subset of switches, a second subset of switches, and a third subset of switches, the first subset of switches each coupled to three respective conductive segments, the second subset of switches each coupled to five respective conductive segments, and the third subset of switches each coupled to eight respective conductive segments.

16. The RF coil assembly of claim 10, wherein each switch is selectively deactivatable in order to decouple the RF coil assembly, and wherein each switch is activatable by an actuation voltage supplied via one or more respective coil-interfacing cables coupled to each switch.

* * * * *